(12) United States Patent
Houck et al.

(10) Patent No.: US 10,962,694 B2
(45) Date of Patent: Mar. 30, 2021

(54) STEPPED STRUCTURE OPTICAL FILTER

(71) Applicant: VIAVI Solutions Inc., San Jose, CA (US)

(72) Inventors: William D. Houck, Santa Rosa, CA (US); Steven Saxe, Santa Rosa, CA (US)

(73) Assignee: VIAVI Solutions Inc., San Jose, CA (US)

( * ) Notice: Subject to any disclaimer, the term of this patent is extended or adjusted under 35 U.S.C. 154(b) by 161 days.

(21) Appl. No.: 16/179,480

(22) Filed: Nov. 2, 2018

(65) Prior Publication Data
US 2020/0142111 A1    May 7, 2020

(51) Int. Cl.
| | | |
|---|---|---|
| *G02B 27/10* | (2006.01) | |
| *G02B 5/26* | (2006.01) | |
| *G02B 5/08* | (2006.01) | |
| *H01L 27/146* | (2006.01) | |

(52) U.S. Cl.
CPC .............. *G02B 5/26* (2013.01); *G02B 5/0816* (2013.01); *H01L 27/14629* (2013.01); *H01L 27/14685* (2013.01)

(58) Field of Classification Search
CPC ... G02B 5/26; G02B 5/0816; H01L 27/14629; H01L 27/14685
USPC .......................................... 359/627; 257/432
See application file for complete search history.

(56) References Cited

U.S. PATENT DOCUMENTS

2009/0302407 A1    12/2009  Gidon et al.
2016/0182786 A1    6/2016  Anderson et al.

FOREIGN PATENT DOCUMENTS

| EP | 2443493 A2 | 4/2012 |
| EP | 3187910 A1 | 7/2017 |
| EP | 3284612 A1 | 2/2018 |

OTHER PUBLICATIONS

Partial European Search Report for Application No. EP19206709.8, dated Mar. 19, 2020, 13 pages.
Raul Josef Molines Colomer, "Evaluation of Chemical Mechanical Planarization Capability of Titan™ Wafer Carrier on Silicon Oxide", 2016, 78 pages.
Wikimedia Commons, "File:Bayer pattern on sensor.svg", https://commons.wikimedia.org/wiki/File:Bayer_pattern_on_sensor.svg, Nov. 2014, 4 pages.
Yang et al., Low Cost and High Performance CMP Solution for Si polishing in Backside Illumination (BSI) Application, ECS Transactions, 2013, 5 pages.
Extended European Search Report for Application No. EP19206709.8, dated Jun. 29, 2020, 11 pages.

*Primary Examiner* — William Choi
(74) *Attorney, Agent, or Firm* — Harrity & Harrity, LLP

(57) ABSTRACT

A filter may include a substrate. The filter may include a stepped medium disposed on the substrate. The filter may include a first mirror disposed on the stepped medium. The first mirror may form a stepped mirror surface. Each step, of the stepped mirror surface may correspond to a channel, of a set of channels, of the filter. The filter may include a spacer disposed on the stepped mirror surface. The filter may include a second mirror disposed on another surface of the spacer.

20 Claims, 19 Drawing Sheets

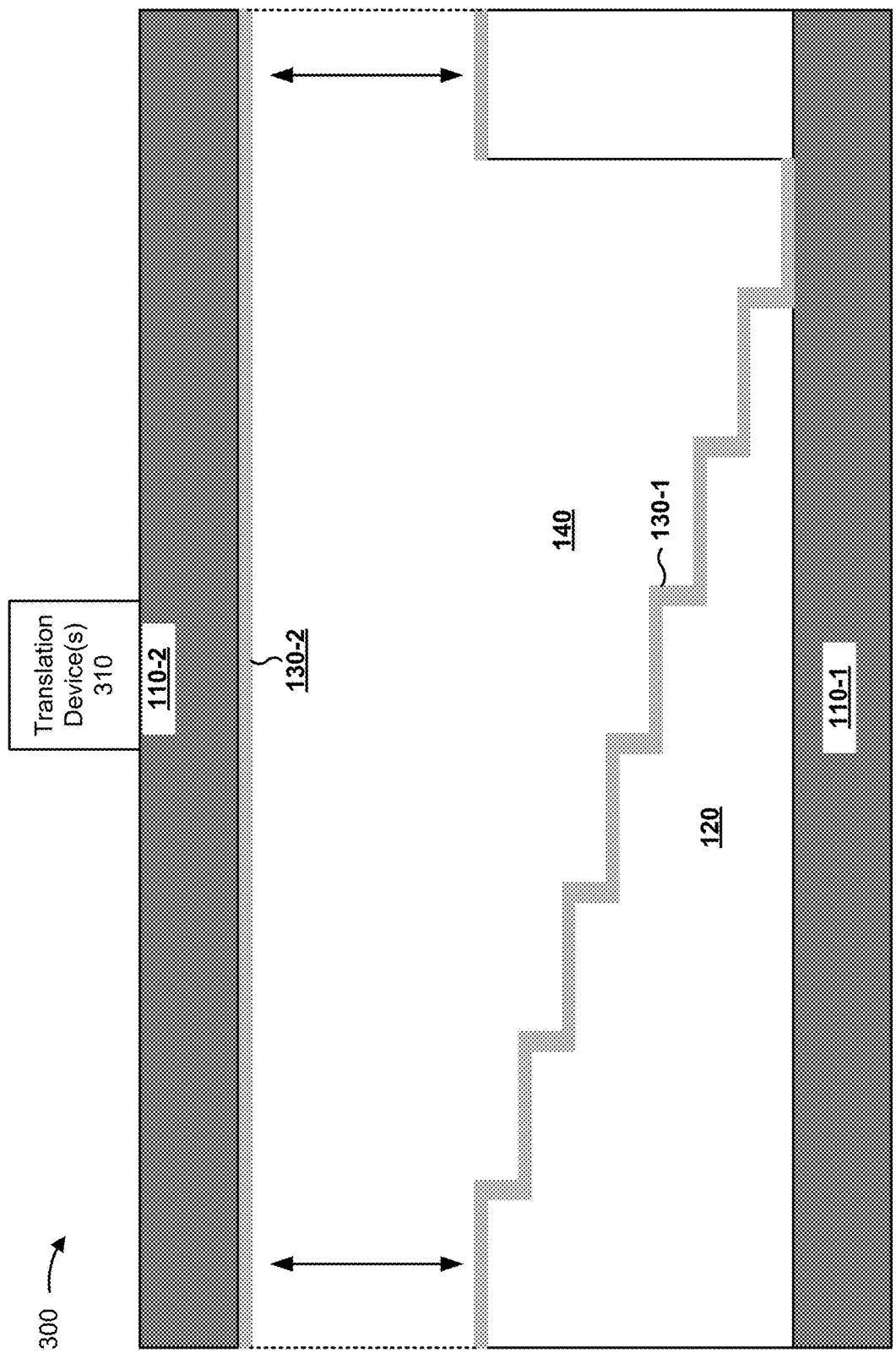

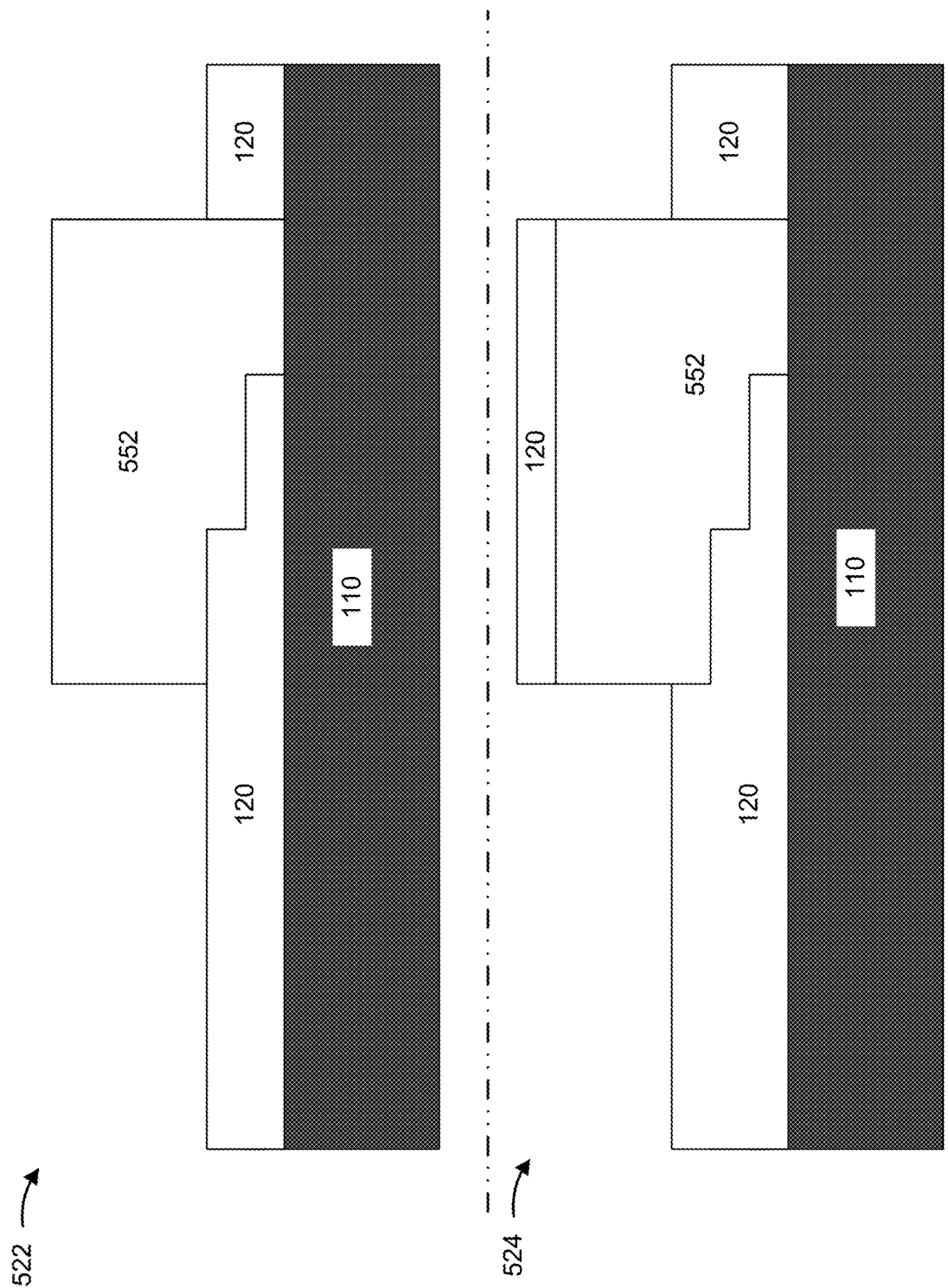

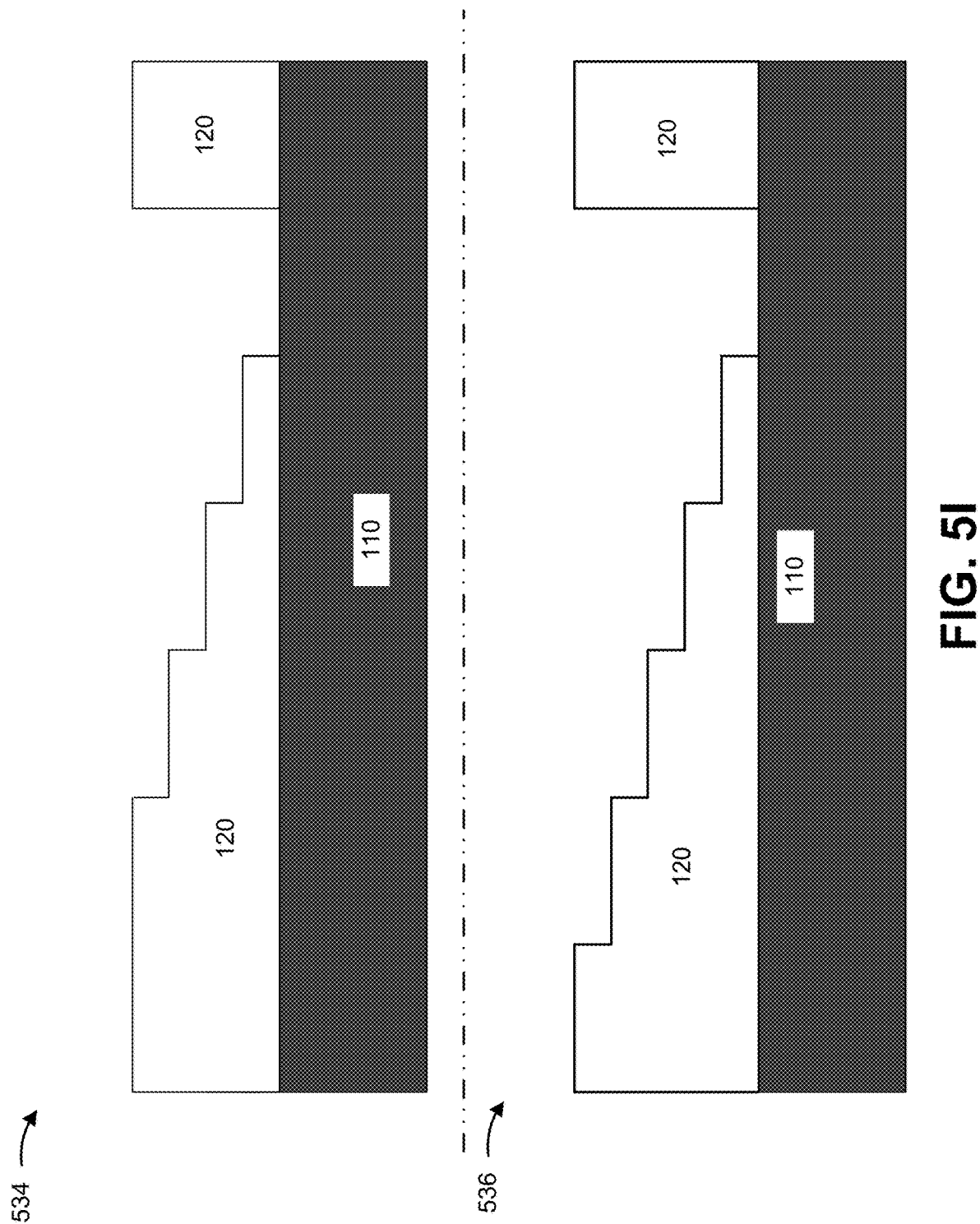

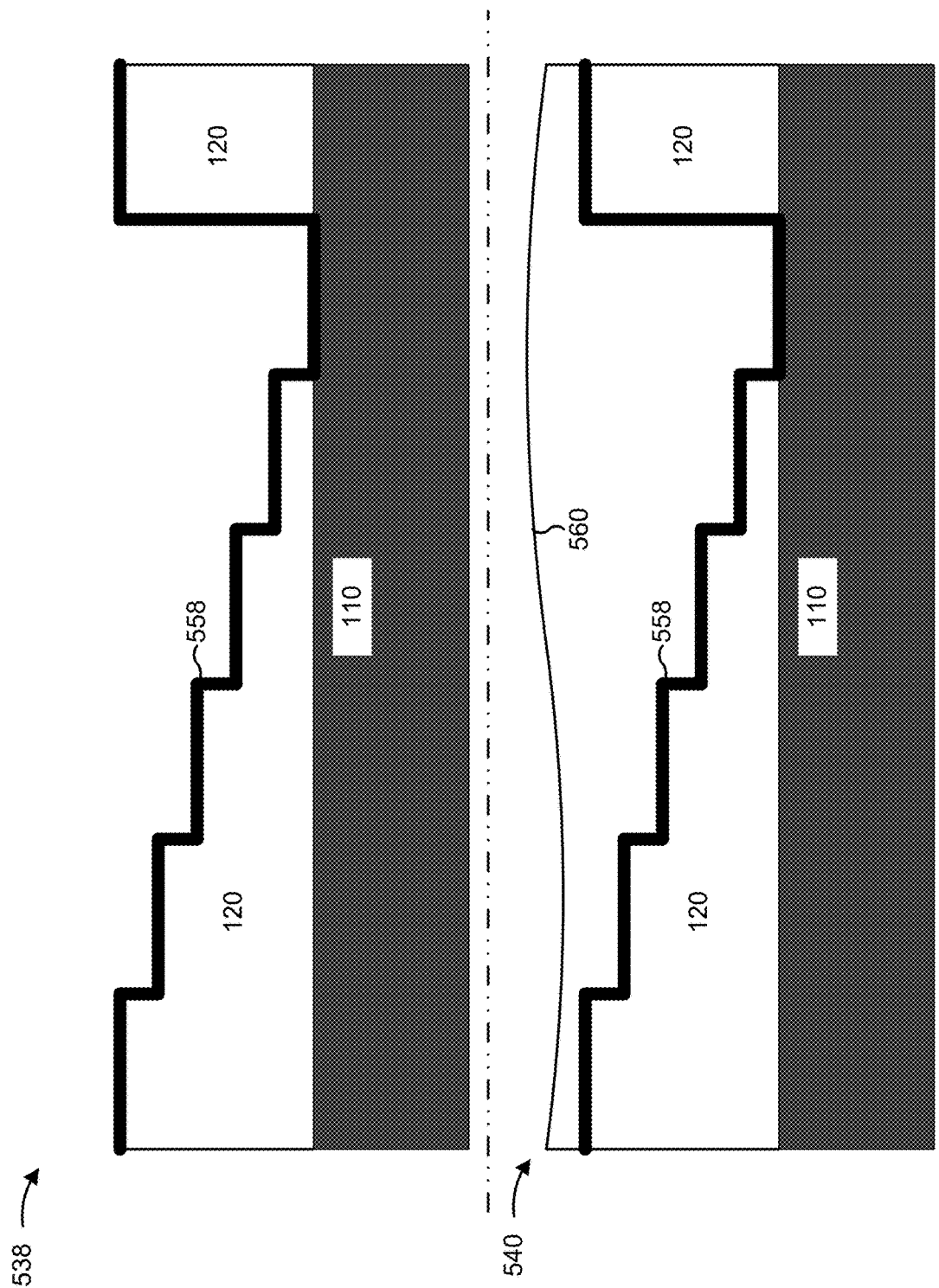

STEPPED STRUCTURE OPTICAL FILTER

BACKGROUND

An optical transmitter may emit light that is directed toward an object. For example, in a gesture recognition system, the optical transmitter may transmit near infrared light toward a user, and the near-infrared light may be reflected off the user toward an optical receiver. In this case, the optical receiver may capture information regarding the near-infrared light, and the information may be used to identify a gesture being performed by the user. In another example, information regarding the visible light, such as information regarding different wavelengths of visible light may be captured to image an object.

However, during propagation of light with a wavelength of interest toward a target and/or during reflection of the light from the target toward the optical receiver, ambient light may be introduced along with the wavelength of interest. For example, when an optical receiver is to receive near infrared light reflected off a target, the optical receiver may also receive visible light (e.g., from another light source, such as a light bulb or the sun). Thus, the optical receiver may be optically coupled to an optical filter, such as a bandpass filter, to filter ambient light and to allow one or more wavelengths of light to pass through toward the optical receiver. Additionally, or alternatively, when performing sensing of multiple wavelengths of light, a filter may be provided to ensure that each wavelength of light, of the multiple wavelengths of light, is directed to a different sensor.

A multispectral sensor device, which may be an optical receiver, may be utilized to capture information about the multiple wavelengths of light. The multispectral sensor device may include a set of sensor elements (e.g., optical sensors, spectral sensors, and/or image sensors) that capture the information and are coupled to a multispectral filter. For example, an array of sensor elements may be utilized to capture information relating to multiple frequencies, and the multispectral filter may direct, to each sensor element, light associated with a different frequency. In some cases, a single binary multispectral filter may be disposed to cover each sensor element of the sensor element array, and may form a set of channels for the sensor element array.

SUMMARY

According to some possible implementations, a filter may include a substrate. The filter may include a stepped medium disposed on the substrate. The filter may include a first mirror disposed on the stepped medium. The first mirror may form a stepped mirror surface. Each step, of the stepped mirror surface may correspond to a channel, of a set of channels, of the filter. The filter may include a spacer disposed on the stepped mirror surface. The filter may include a second mirror disposed on another surface of the spacer.

According to some possible implementations, a system may include a sensor element array comprising a plurality of sensor elements associated with a plurality of channels. The system may include a variable spacer filter. The variable spacer filter may include a first substrate. The variable spacer filter may include a stepped medium disposed on the first substrate. The variable spacer filter may include a first mirror disposed on the stepped medium. The first mirror may form a stepped mirror surface. Each step, of the stepped mirror surface may correspond to a channel, of a set of channels, of the filter. The variable spacer filter may include a second mirror disposed on a second substrate and alignable to the first mirror. A cavity may separate the first mirror and the second mirror. The second mirror may be translatable with respect to the first mirror such that a spacing between the first mirror and the second mirror is variable.

According to some possible implementations, a multichannel filter may include a medium to form a stepped structure. The multichannel filter may include a first mirror, disposed on the stepped structure, to form a stepped mirror structure. Each step, of the stepped mirror structure, may form a wavelength channel of the multichannel filter. The multichannel filter may include a spacer disposed on the first mirror. A first surface of the spacer may be disposed against the first mirror to form a stepped surface and a second surface of the spacer is opposite the first mirror to form a flat surface. The multichannel filter may include a second mirror, disposed on the second surface of the spacer form a flat mirror for the multichannel filter.

BRIEF DESCRIPTION OF THE DRAWINGS

FIGS. 3A-3D are diagrams of example implementations of a multispectral filter described herein.

FIGS. 5A-5K are diagrams of an example implementation of a multispectral filter relating to the example process of FIG. 4.

DETAILED DESCRIPTION

Figure 1:
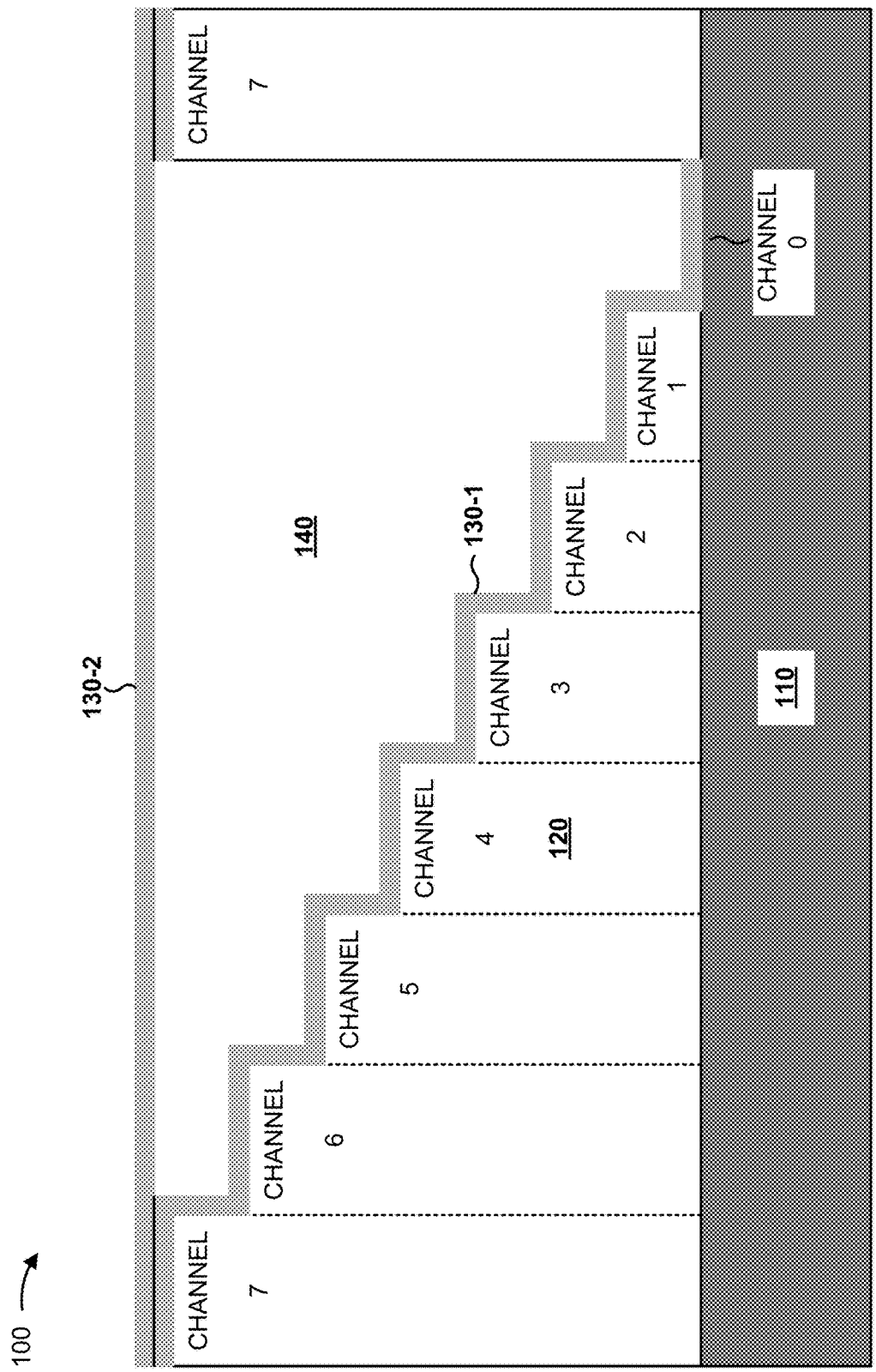
FIG. 1 is a diagram of an example implementation of a multispectral filter described herein.

The following detailed description of example implementations refers to the accompanying drawings. The same reference numbers in different drawings may identify the same or similar elements.

A sensor element (e.g., an optical sensor) may be incorporated into an optical sensor device to obtain information (e.g., spectral data) regarding a set of electromagnetic frequencies. For example, the optical sensor device may include an image sensor, a multispectral sensor, and/or the like that may perform a sensor measurement of light. The optical sensor device may utilize one or more sensor technologies, such as a complementary metal-oxide-semiconductor (CMOS) technology, a charge-coupled device (CCD) technology, and/or the like. The optical sensor device may include multiple sensor elements (e.g., an array of sensor elements) each configured to obtain information about a different frequency of light.

A sensor element may be associated with a filter that filters light to the sensor element. For example, the sensor element may be aligned with a linear variable filter (LVF), a circular variable filter (CVF), a Fabry-Perot filter, and/or the like to cause a portion of light directed toward the sensor element to be filtered. For a binary filter structure, such as a Fabry-Perot filter, a spacer may be positioned between reflectors (e.g., mirrors) of the binary filter structure. Configuration of refractive indices, thicknesses, and/or the like of layers of the reflectors, layers of the spacer, and/or the like may enable configuration of the binary filter structure to form a set of channels. A channel may be a portion of the filter that directs light of a particular wavelength range to a sensor element of a sensor element array. In this way, the sensor element array may obtain information regarding multiple different wavelengths of light.

However, a fixed set of channels configured based at least in part on selected refractive indices, spacer thicknesses, and/or the like may limit a sensor element array to performing measurements of a fixed set of wavelengths. Thus, to ensure that a binary multispectral filter, which may also be termed a multichannel filter, is configured to capture whichever wavelengths of light are of interest, the binary multispectral filter may be designed with greater than a threshold quantity of channels and a sensor element array may, correspondingly, include greater than a threshold quantity of sensor elements. This may result in excessive size and/or an excessive cost to ensure flexibility in using a binary multispectral filter.

Further, some binary multispectral filters use different spacer thicknesses to form different channels at different wavelength ranges. For these binary multispectral filters, the different spacer thicknesses may be formed by depositing multiple layers of a spacer material on top of a first flat mirror, which is deposited directly on a substrate. In this case, the multiple layers of the spacer material are deposited to form a stepped structure spacer, and a second mirror is deposited onto the stepped structure of the spacer. However, depositing multiple layers of the spacer material may result in imperfections, which may reduce optical performance of a binary multispectral filter. For example, when hydrogenated silicon is used for the spacer material, a surface of each layer of the hydrogenated silicon may partially oxidize into silicon dioxide in between layer depositions, which may result in a reduced transmissivity, an increased angle shift, and/or the like.

Some implementations, described herein, provide a multispectral filter array with an improved spacer. For example, a binary multispectral filter may include a stepped medium disposed between a substrate and a first mirror, causing the first mirror to have a stepped surface, a monolithic spacer disposed on the stepped surface of the mirror, and a second mirror disposed on a flat surface of the monolithic spacer. In this case, based on forming the spacer in a single procedure, rather than depositing multiple spacer layers to build a stepped structure, imperfections, such as surface oxidation, may be avoided, thereby improving optical performance. For example, a monolithic spacer may enable improved transmissivity, reduced angle shift, and/or the like.

Moreover, some implementations, described herein, may enable the second mirror to be movable with respect to the first mirror, rather than disposed directly on the spacer and disposed in a fixed position. For example, the second mirror may be translatable relative to the first mirror (i.e., either the first mirror or the second mirror or both the first mirror and the second mirror may be moved), thereby enabling a gap between the first mirror and the second mirror, formed by the spacer, to vary in thickness as the second mirror is translated. In this way, a wavelength range of a set of channels may be dynamically reconfigurable, thereby increasing a quantity of spectral bands that can be captured by sensor elements aligned to the set of channels. Moreover, in this way, a quantity of channels in the multispectral filter to cover a particular spectral range may be decreased relative to a multispectral filter with a fixed gap between mirrors, thereby achieving reduced size, reduced cost, and/or the like.

FIG. 1 is a diagram of an example implementation of a multispectral filter 100 described herein. As shown in FIG. 1, a multispectral filter 100 (e.g., a binary structure optical filter array) may include a substrate 110, a medium 120, a first mirror 130-1, a second mirror 130-2, and a spacer 140.

In some implementations, substrate 110 may be associated with an optical sensor device. For example, substrate 110 may include an array of sensor elements to capture information (e.g., spectral data). Additionally, or alternatively, substrate 110 may not include sensor elements, and multispectral filter 100 may be aligned to sensor elements disposed on another substrate. Additionally, or alternatively, multispectral filter 100 may be designed without substrate 110. For example, multispectral filter 100 may be positioned in free space, may be disposed onto a substrate of an optical sensor device not part of multispectral filter 100, and/or the like.

In some implementations, multispectral filter 100 may be associated with a particular spectral range. For example, multispectral filter 100 may be associated with multiple channels in a visible spectral range, a near infrared (NIR) spectral range, a mid-infrared (MIR) spectral range, and/or the like. In this case, multispectral filter 100 may be associated with a spectral range of between approximately 300 nanometers (nm) and 2500 nm, 360 nanometers (nm) and 2500 nm, between approximately 600 nm and approximately 2000 nm, between approximately 350 nm and approximately 750 nm, 380 nm and approximately 780 nm, between approximately 750 nm and approximately 1500 nm, 750 nm and approximately 1100 nm, 900 nm and approximately 2500 nm, between approximately 900 nm and approximately 1700 nm, between approximately 900 nm and approximately 1500 nm, and/or the like. In some implementations, multispectral filter 100 may include a threshold quantity of channels, such as greater than or equal to 8 channels, 16 channels, 32 channels, 64 channels, 128 channels, 256 channels, and/or the like.

As further shown in FIG. 1, medium 120 may be associated with a stepped structure, which may form a set of channels for multispectral filter 100. For example, medium 120 may be formed, as described in more detail herein, using a photolithographic procedure to form the stepped structure. In some implementations, medium 120 may be stepped along a single axis (i.e., stepped in one dimension), as shown. For example, medium 120 may be stepped to form a set of 8 different channels extending along the single axis. In some implementations, medium 120 may be stepped along multiple axes (i.e., stepped in two dimensions). For example, medium 120 may be stepped orthogonal to the single axis to form a total of 64 different channels. In some implementations, medium 120 may include one or more repeated channels. For example, as shown, Channel 7 formed by medium 120 may be disposed at edges of multispectral filter 100, which may provide structural stability for multispectral filter 100. In some implementations, medium 120 may cause one or more channels to be inactive. For example, portions of first mirror 130-1 and second mirror 130-2, which are aligned with a pillar of medium 120 forming Channel 7, may not sandwich a portion of spacer 140. This may result in Channel 7 being inactive (but remaining for structural support). Additionally, or alternatively, a portion of spacer 140 may be sandwiched by first mirror 130-1 and second mirror 130-2 to cause Channel 7 to be an active channel.

In some implementations, medium 120 may be formed using a particular material. For example, medium 120 may be formed from a material that is transmissive to a wavelength range for which multispectral filter 100 is to capture spectral data. In this case, the material may include a tantalum based medium material, a niobium based medium material, a silicon dioxide based medium material, an oxide based medium material, a III-V semiconductor based medium material, a gallium phosphide based medium material, a germanium based medium material, germanium silicon based medium material, a dielectric based medium material, a polymer based medium material, a nitride based medium material, a phosphide based medium material, a carbide based medium material, a combination thereof, and/or the like.

As further shown in FIG. 1, first mirror 130-1 and second mirror 130-2 may sandwich spacer 140. In other words, spacer 140 may separate first mirror 130-1 and second mirror 130-2 by a set of distances and/or faces of spacer 140 may be enclosed by first mirror 130-1 and second mirror 130-2. In this case, the set of distances may form different channels. For example, a first portion of first mirror 130-1 and second mirror 130-2 aligned to Channel 0 may be separated by a first distance, and may form a first channel that passes through a first wavelength band of light. Similarly, a second portion of first mirror 130-1 and second mirror 130-2 aligned to Channel 1 may be separated by a second distance, as a result of medium 120 having a stepped structure and causing a stepped structure for spacer 140, as described in more detail herein, and may form a second channel that passes through a second wavelength band of light. In this case, the first channel may be aligned to a first sensor element and may form a first component filter for obtaining spectral data regarding the first spectral range and the second channel may be aligned to a second sensor element and may form a second component filter for obtaining spectral data regarding the second spectral range.

In some implementations, mirrors 130 may be associated with a particular material. For example, mirrors 130 may include a set of metal mirror layers (e.g., silver), a set of dielectric mirror layers (e.g., alternating hydrogenated silicon layers and silicon dioxide layers), and/or the like to direct a portion of light directed from a light source toward sensor elements associated with multispectral filter 100. In some implementations, mirrors 130 may align with each sensor element, of a sensor element array, associated with each channel of multispectral filter 100.

In some implementations, spacer 140 may be a monolithically formed spacer, as described in more detail herein. For example, spacer 140 may be formed by depositing a material onto a stepped surface of first mirror 130-1, such that a first surface of spacer 140 at an interface with first mirror 130-1 is a stepped surface and a second surface of spacer 140 at an interface with second mirror 130-2 is a flat surface. In some implementations, spacer 140 may be formed from a particular material to cause multispectral filter 100 to have a particular wavelength range, transmissivity (e.g., greater than 50%, greater than 70%, greater than 90%, greater than 95%, greater than 99%, greater than 99.9%, greater than 99.99%, etc.), and/or the like. For example, spacer 140 may be a hydrogenated silicon based spacer, an oxide based spacer, a germanium based spacer, a silicon germanium based spacer, a polymer spacer, a combination thereof, and/or the like. In some implementations, spacer 140 may have a refractive index greater than 1.5, greater than 1.7, greater than 2.5, greater than 3.0, greater than 3.5, and/or the like.

In some implementations, spacer 140 may include a non-solid spacer material. For example, spacer 140 may be formed from a gaseous material (e.g., air or another gaseous material) or a liquid material to enable a size of spacer 140 (i.e., a separation between first mirror 130-1 and second mirror 130-2) to be expanded or contracted, as described in more detail herein. In some implementations, spacer 140 may include multiple spacer materials. For example, spacer 140 may include a solid spacer forming a first portion of spacer 140 and covering first mirror 130-1 and a liquid spacer forming a second portion of spacer 140 and enabling second mirror 130-2 to be translated with respect to first mirror 130-1. Similarly, spacer 140 may include a first solid spacer covering first mirror 130-1, a second solid spacer covering second mirror 130-2, and a third liquid spacer disposed between the first solid spacer and the second solid spacer to enable second mirror 130-2 to be translated with respect to first mirror 130-1. In this way, based on having a stepped structure, spacer 140 enables different portions of multispectral filter 100 to pass different wavelength bands of light to form different channels. Further, based on being formed without multiple layers of material or with less than a threshold quantity of layers of material, spacer 140 may be associated with less than a threshold level of imperfections, such as less than a threshold amount of surface oxidation within spacer 140, thereby improving optical performance of multispectral filter 100.

In some implementations, layers forming, for example, medium 120, first mirror 130-1, second mirror 130-2, spacer 140, and/or the like may include a set of layers of a high refractive index material (H layers), such as silicon layers, hydrogenated silicon layers, silicon-germanium (SiGe) layers, hydrogenated germanium layers, hydrogenated silicon-germanium layers, and/or the like. In some implementations, the layers forming, for example, medium 120, first mirror 130-1, second mirror 130-2, spacer 140, and/or the like may include a set of a low refractive index material (L layers), such as silicon dioxide layers, silicon nitride layers, tantalum pentoxide ($Ta_2O_5$) layers, niobium pentoxide ($Nb_2O_5$) layers, titanium dioxide ($TiO_2$) layers, aluminum oxide ($Al_2O_3$) layers, zirconium oxide ($ZrO_2$) layers, yttrium oxide ($Y_2O_3$) layers, silicon nitride ($Si_3N_4$) layers, a combination thereof, and/or the like. Although some layers may be described as a particular material, such as silicon germanium, some layers may include (small quantities of) phosphor, boron, nitride, and/or the like.

In some implementations, the layers forming, for example, medium 120, first mirror 130-1, second mirror 130-2, spacer 140, and/or the like may be associated with a particular quantity of layers, such as alternating high refractive index layers and low refractive index layers, in a range of 2 layers to 200 layers. In some implementations, one or more layers may be fabricated using a sputtering procedure, a photolithographic procedure, an etching procedure, a lift off procedure, a scraping procedure, an annealing procedure, a molding procedure, a casting procedure, a machining procedure, a stamping procedure and/or the like.

In some implementations, each layer of the layers forming, for example, medium 120, first mirror 130-1, second mirror 130-2, spacer 140, and/or the like may be associated with a particular thickness. For example, each layer may be associated with a thickness of between approximately 1 nm and approximately 1500 nm, between approximately 10 nm and approximately 500 nm, and/or the like. Additionally, or alternatively, multispectral filter 100 may be associated with a thickness of between approximately 0.1 μm and approximately 100 μm, approximately 0.25 μm and approximately 100 μm, and/or the like.

In this way, multispectral filter 100 forms multiple channels for capturing spectral data regarding multiple wavelength ranges with a reduced amount of imperfections formed in spacer 140, thereby improving optical performance of multispectral filter 100.

As indicated above, FIG. 1 is provided merely as an example. Other examples are possible and may differ from what was described with regard to FIG. 1.

Figure 2:
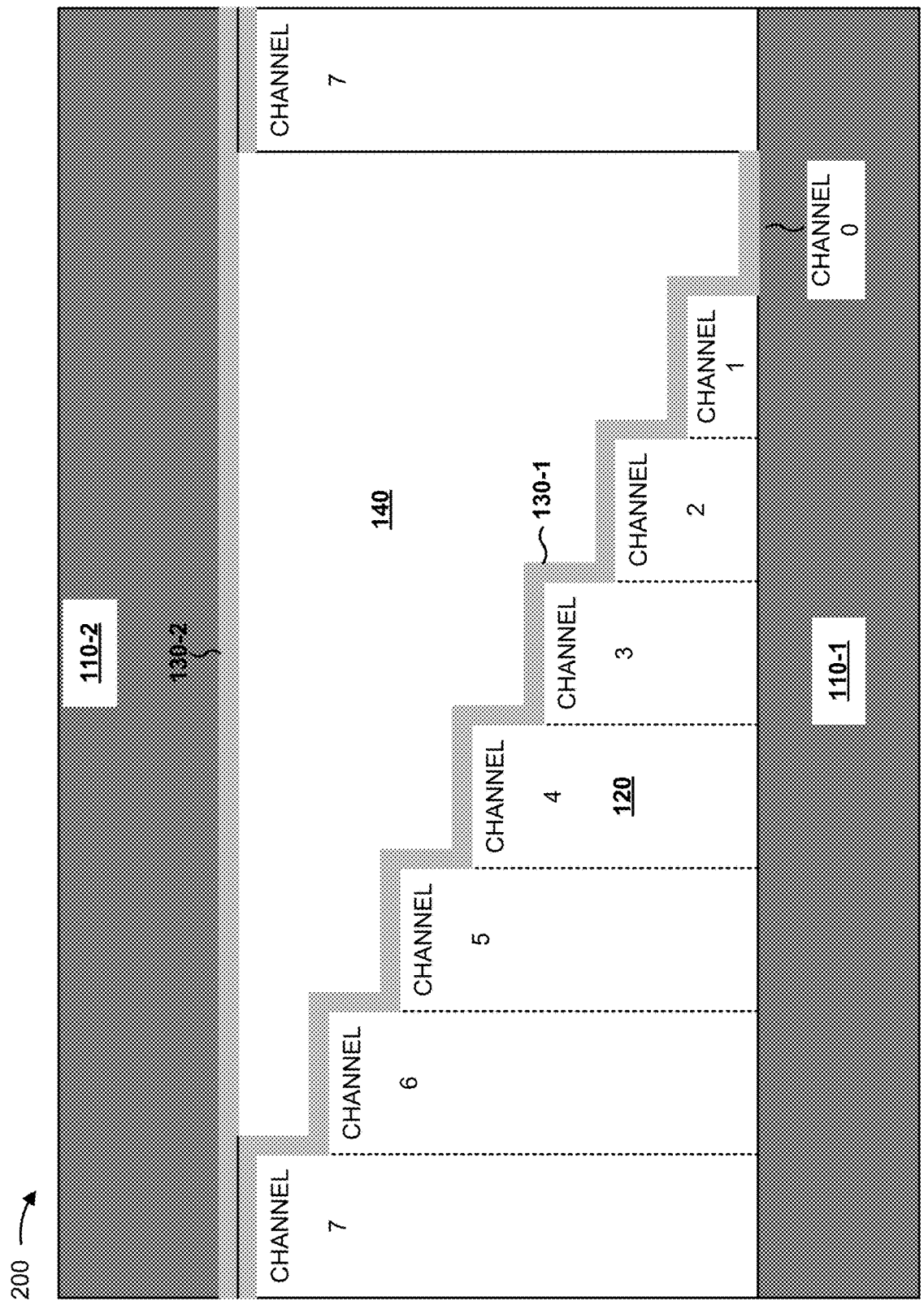
FIG. 2 is a diagram of an example implementation of response balancing for filter channels of a multispectral filter described herein.

FIG. 2 is a diagram of an example implementation of a multispectral filter 200 described herein. As shown in FIG. 2, multispectral filter 200 may include a first substrate 110-1, a second substrate 110-2, a medium 120, a first mirror 130-1, a second mirror 130-2, and a spacer 140.

In some implementations, second substrate 110-2 may be deposited onto second mirror 130-2. For example, second mirror 130-2 may be deposited onto spacer 140, and second substrate 110-2 may be deposited onto second mirror 130-2. Additionally, or alternatively, second mirror 130-2 may be deposited onto second substrate 110-2. For example, medium 120 may be deposited on first substrate 110-1, first mirror 130-1 may be deposited on medium 120, spacer 140 may be deposited onto first mirror 130-1, second mirror 130-2 may be deposited on second substrate 110-2, and second mirror 130-2 and second substrate 110-2 may be aligned to first mirror 130-1 and first substrate 110-1.

As indicated above, FIG. 2 is provided merely as an example. Other examples are possible and may differ from what was described with regard to FIG. 2.

Figure 3A:
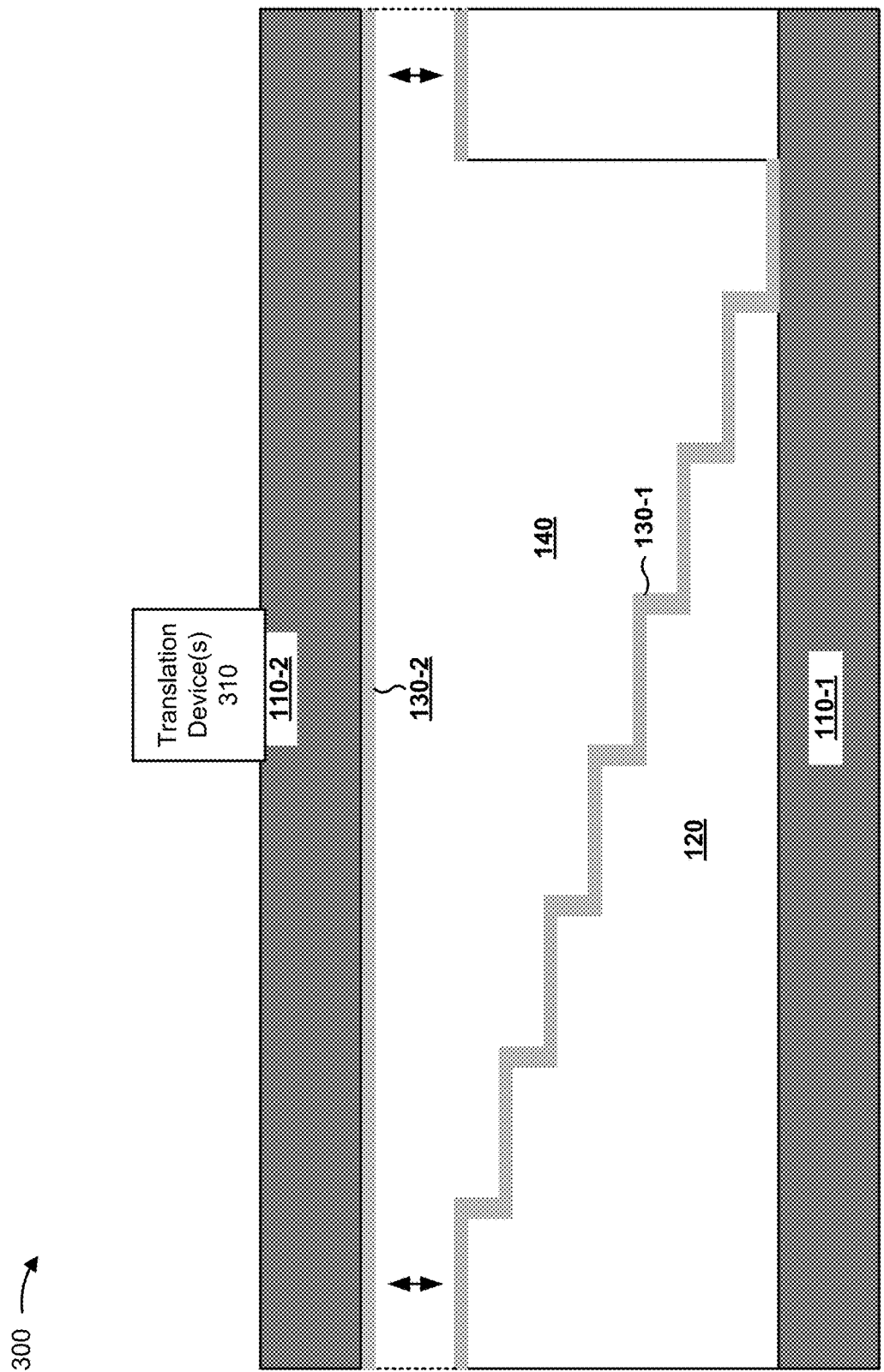

FIGS. 3A-3D are diagrams of an example implementation of a multispectral filter 300 described herein. As shown in FIG. 3A, multispectral filter 300 may include a first substrate 110-1, a second substrate 110-2, a medium 120, a first mirror 130-1, a second mirror 130-2, and a spacer 140. As further shown in FIG. 3A, multispectral filter 300 is attached to one or more translation devices 310.

As further shown in FIG. 3A, second mirror 130-2 of multispectral filter 300 may be movable with respect to first mirror 130-1 to cause spacer 140 to have a variable thickness, which may alter a spectral range of light passed by channels of multispectral filter 200. Although some implementations, described herein, are described in terms of second mirror 130-2 being translated, tilted, or otherwise moved with respect to a fixed first mirror 130-1, first mirror 130-1 may be moved with respect to second mirror 130-2, both first mirror 130-1 and second mirror 130-2 may be moved by translation devices 310, and/or the like.

As shown in FIG. 3B, second mirror 130-2 is translated by translation device 310 with respect to first mirror 130-1. For example, second substrate 110-2 and second mirror 130-2 may be moved further away from first substrate 110-1 and first mirror 130-1 with respect to a position shown in FIG. 3A. In some implementations, translation device 310 may be a focusing element, a voice-coil motor, a piezo-electric transducer, a silicon micro-electro-mechanical system (MEMS) device, a thermo-mechanical device, a bi-stable beam switch, and/or the like.

Figure 3C:
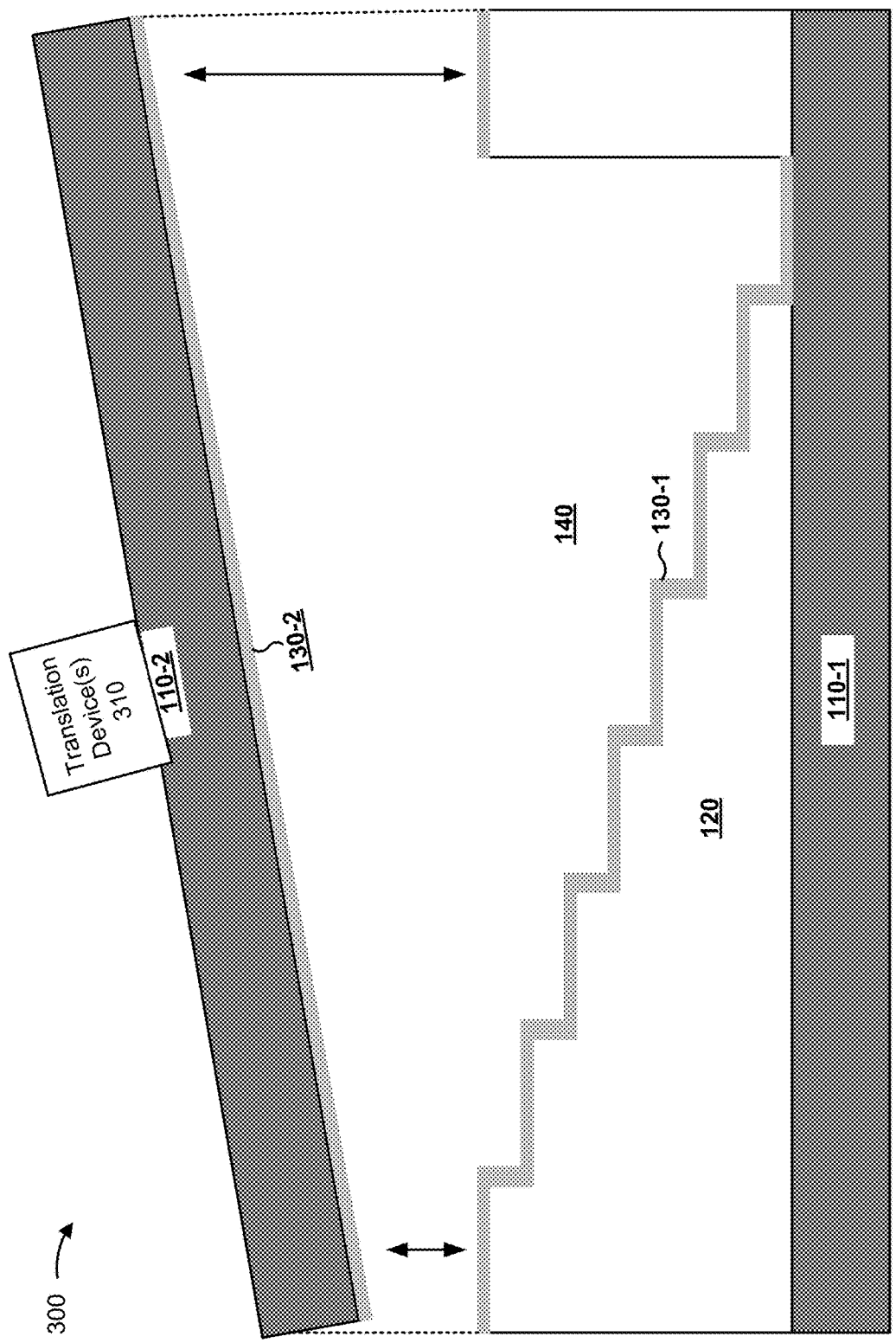

As shown in FIG. 3C, second mirror 130-2 may be translated by translation device 310 such that second mirror 130-2 is tilted with respect to first mirror 130-1. For example, second substrate 110-2 may be attached to a tilting device, multiple translation devices, and/or the like. In this way, a wavelength range of channels of multispectral filter 300 may be further configured by reducing a separation between second mirror 130-2 and first mirror 130-1 for a first portion of channels, increasing a separation between second mirror 130-2 and first mirror 130-1 for a second portion of channels, maintaining a separation between second mirror 130-2 and first mirror 130-1 for a third portion, and/or the like.

In some implementations, a movement device may move second mirror 130-2 with respect to first mirror 130-1 based on a particular timing configuration. For example, during a read-out of sensor elements aligned to channels of multispectral filter 300, the movement device may be triggered to move second mirror 130-2 to cause some channels to be associated with different wavelength ranges and other channels to maintain a default wavelength range. As an example, when a multispectral filter includes multiple channels with a common wavelength range, as shown in FIGS. 1 and 2 with regard to the multiple Channel 7's, the movement device may be triggered to cause a first sensor element of a first channel associated with the common wavelength range to read out at a first position of second mirror 130-2 and a second sensor element of a second channel associated with the common wavelength range to read out at a second position of second mirror 130-2. In this way, the multispectral filter 200 may enable multiple spectral ranges using a common channel. Moreover, the movement device may cause the first sensor element to read out at the first position and at the second position, resulting in capture of multiple spectral ranges using a single channel.

In some implementations, spacer 140 may be constrained to enable to enable a variable spacer width based on translating second mirror 130-2 with respect to first mirror 130-1. For example, spacer 140 may be a gaseous spacer or a liquid spacer that may be encapsulated by multispectral filter 300 to enable the gaseous spacer or the liquid spacer to expand and/or contract as second mirror 130-2 is translated with respect to first mirror 130-1. Additionally, or alternatively, spacer 140 may be constrained such that additional gaseous spacer material or liquid spacer material may be provided into a gap between second mirror 130-2 and first mirror 130-1 and/or removed from the gap to enable the spacer to provide a variable thickness.

Figure 3D:
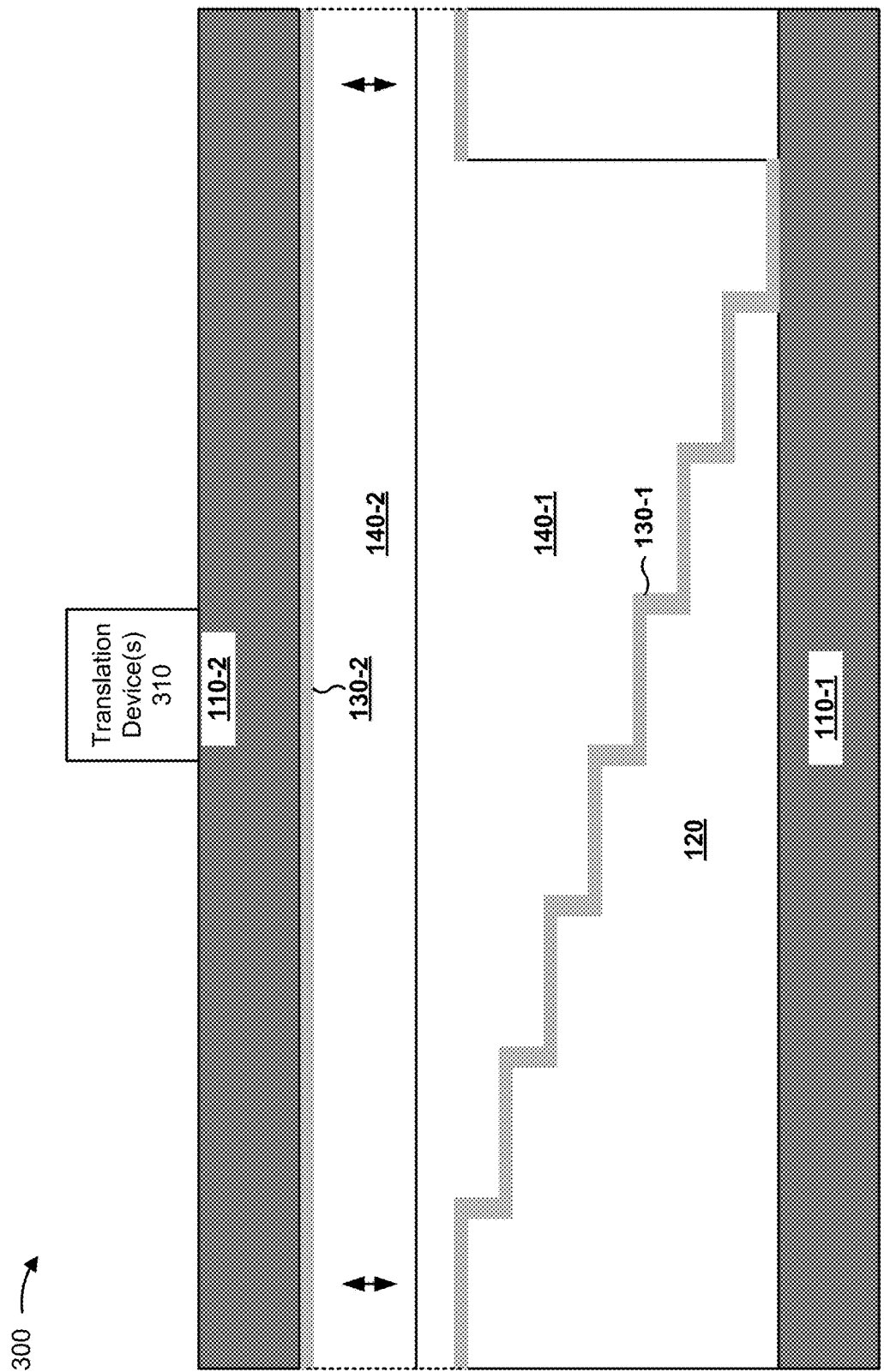

As shown in FIG. 3D, multiple spacers 140, such as a first spacer 140-1 and a second spacer 140-2 may be disposed between first mirror 130-1 and second mirror 130-2. For example, first spacer 140-1 may be a solid spacer that covers first mirror 130-1, and second spacer 140-2 may be a gaseous (or liquid) spacer that enables a variable separation between first mirror 130-1 and second mirror 130-2.

As indicated above, FIGS. 3A-3D are provided merely as examples. Other examples are possible and may differ from what was described with regard to FIGS. 3A-3D.

Figure 4:
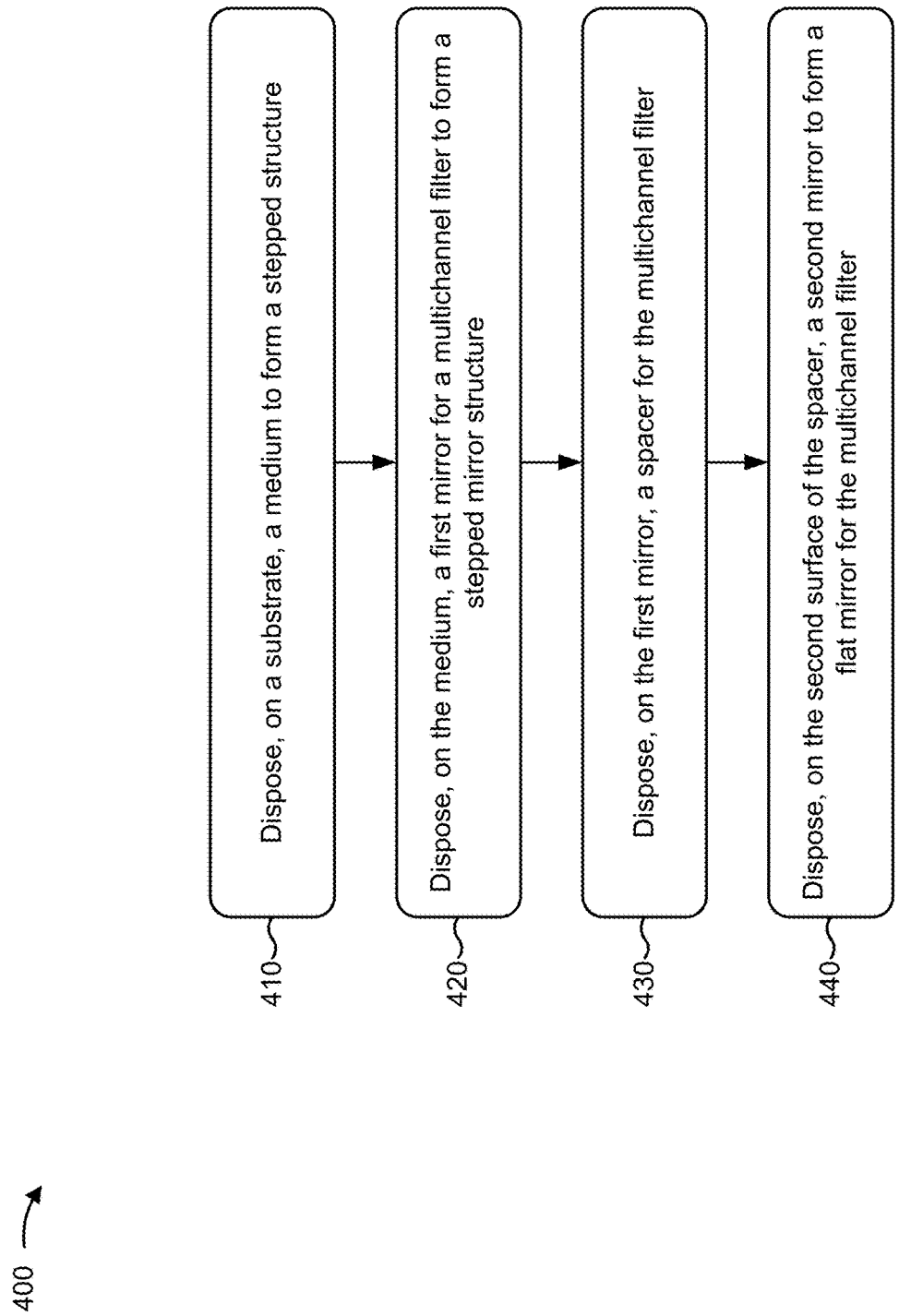
FIG. 4 is a diagram of an example process for manufacturing a multispectral filter described herein.

FIG. 4 is a flow chart of an example process 400 for manufacturing a multispectral filter described herein. In some implementations, one or more process blocks of FIG. 4 may be performed by a deposition device during a manufacturing procedure, such as by an etching device, a sputtering device, a photolithographic device, and/or the like.

As shown in FIG. 4, process 400 may include disposing, on a substrate, a medium to form a stepped structure (block 410). For example, a deposition device may deposit the medium on the substrate to form the stepped structure. In some implementations, the deposition device may deposit multiple layers of medium to form the stepped structure. For example, multiple layers of photolithographic material may be deposited and multiple layers of medium may be deposited to form the stepped structure. In this case, the multiple layers of photolithographic material may be exposed to light in connection with a photomask to selectively remove the photolithographic material and cause the multiple layers of medium to form the stepped structure. Photolithographic formation of the stepped structure for the medium is described in detail with regard to FIGS. 5A-5K. Additionally, or alternatively, the medium may be disposed on the substrate to form the stepped structure using an etching procedure. For example, a medium may be deposited onto a substrate and then etched to form a stepped structure. Although some implementations, described herein, are described in terms of a photolithographic procedure or an etching procedure, other procedures for forming a stepped medium structure are possible.

As shown in FIG. 4, process 400 may include disposing, on the medium, a first mirror for a multichannel filter to form a stepped mirror structure (block 420). For example, the deposition device may deposit the first mirror on the medium. In this case, the first mirror may form a stepped structure based on the medium, on which the first mirror is deposited, having a stepped structure.

As shown in FIG. 4, process 400 may include disposing, on the first mirror, a spacer for the multichannel filter (block 430). For example, the deposition device may deposit the spacer on the first mirror. In this case, the spacer may be a solid spacer deposited using a single deposition step, which may reduce surface layer oxidation based effects to optical performance relative to depositing the spacer using multiple deposition and etching steps. Additionally, or alternatively, the spacer may be a liquid spacer or a gaseous spacer that may be inserted into a cavity formed by the first mirror and a second mirror, which may enable a variable spacer binary multispectral filter with a translatable mirror. In some implementations, the spacer may form a flat surface. For example, the spacer may be deposited onto the first mirror such that a first surface interfacing with a stepped mirror surface of the first mirror is stepped and such that a second surface on an opposite side of the spacer is flat. In this case, the spacer may be etched to remove a portion of the spacer to form the flat surface. In some implementations, the first mirror or the medium may form an etch stop for etching the spacer to form the flat surface.

As shown in FIG. 4, process 400 may include disposing, on the second surface of the spacer, a second mirror to form a flat mirror for the multichannel filter (block 440). For example, the deposition device may deposit the second mirror on the second surface of the spacer such that the mirror is a flat mirror. In some implementations, the second mirror may be aligned to the first mirror. For example, the second mirror may be deposited onto another substrate, and the second mirror and the other substrate may be aligned to the first mirror such that the second mirror and the other substrate are translatable with respect to the first mirror to form a variable thickness spacer. In this way, a multispectral filter may be formed with multiple channels.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

FIGS. 5A-5K are diagrams of an example implementation relating to process 400. FIGS. 5A-5K show an example process for manufacturing a multispectral filter described herein.

Figure 5A:
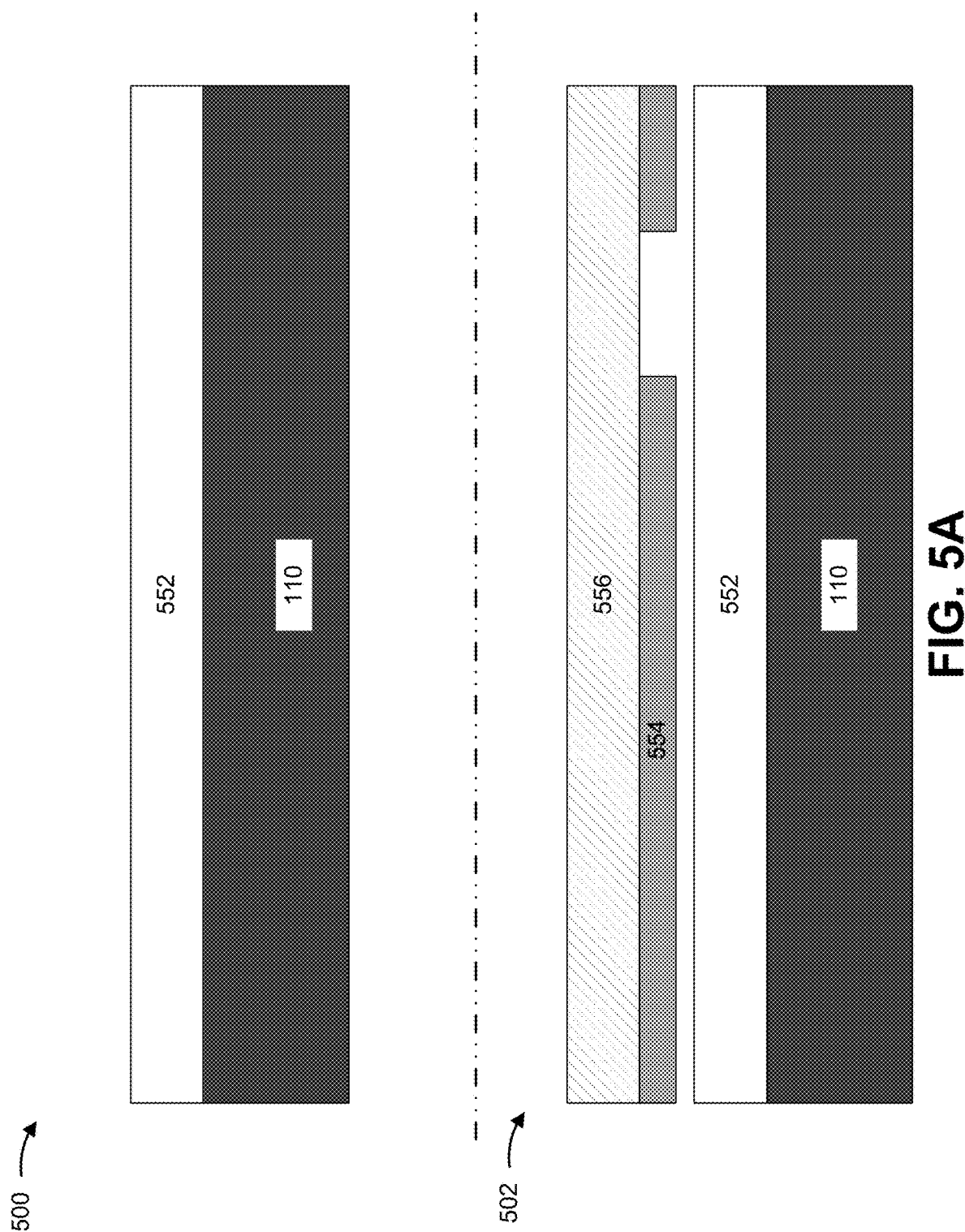

As shown in FIG. 5A, and by diagram 500, photoresist 552 may be deposited onto substrate 110. As shown by diagram 502, photomask 554 and 556 may positioned over photoresist 552.

Figure 5B:
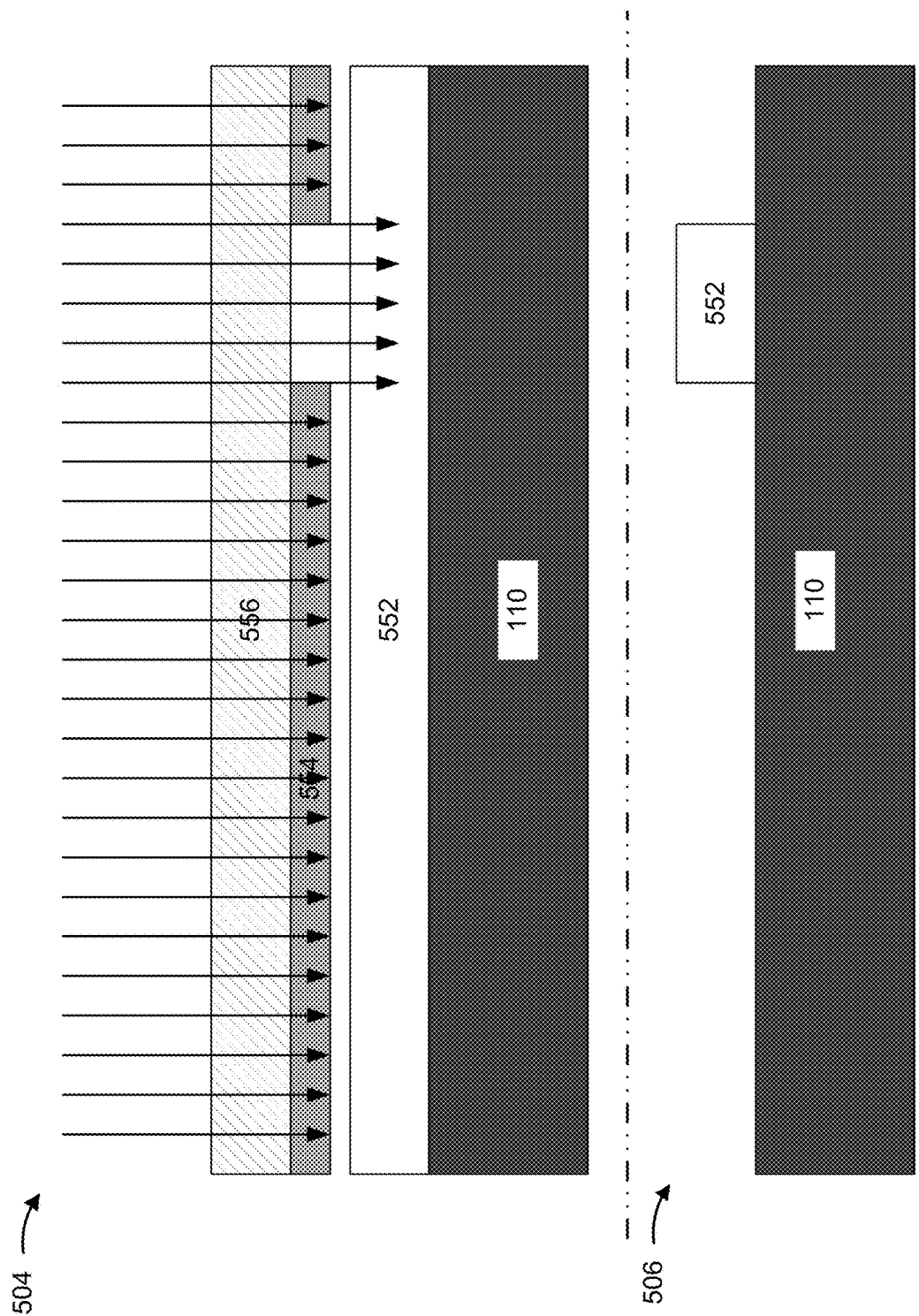

As shown in FIG. 5B, and by diagram 504, photomask 554 and 556 and a portion of photoresist 552 not covered by photomask 554 and 556 may be exposed to light. As shown by diagram 506, based on the exposure to light, the portion of photoresist 552 not covered by photomask 554 and 556 may remain disposed on substrate 110.

Figure 5C:
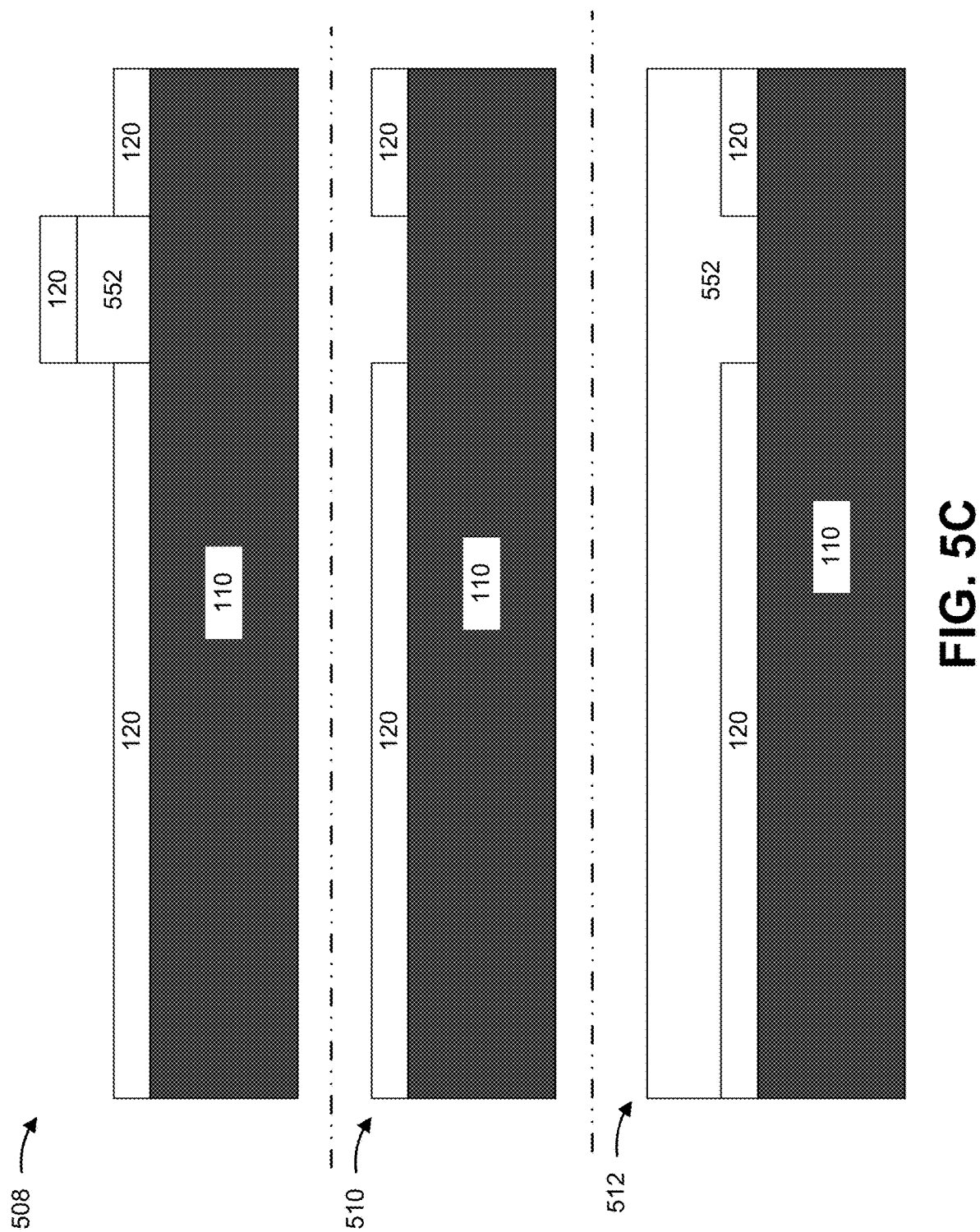

As shown in FIG. 5C, and by diagram 508, a layer of medium 120 may be deposited onto substrate 110 and the remaining portion of photoresist 552. As shown by diagram 510, the remaining portion of photoresist 552 may be removed. In this case, portions of the layer of medium 120 deposited onto substrate 110 may remain, forming a first step where the remaining portion of photoresist 552 was removed. As shown by diagram 512, another layer of photoresist 552 may be deposited onto medium 120 and substrate 110.

Figure 5D:
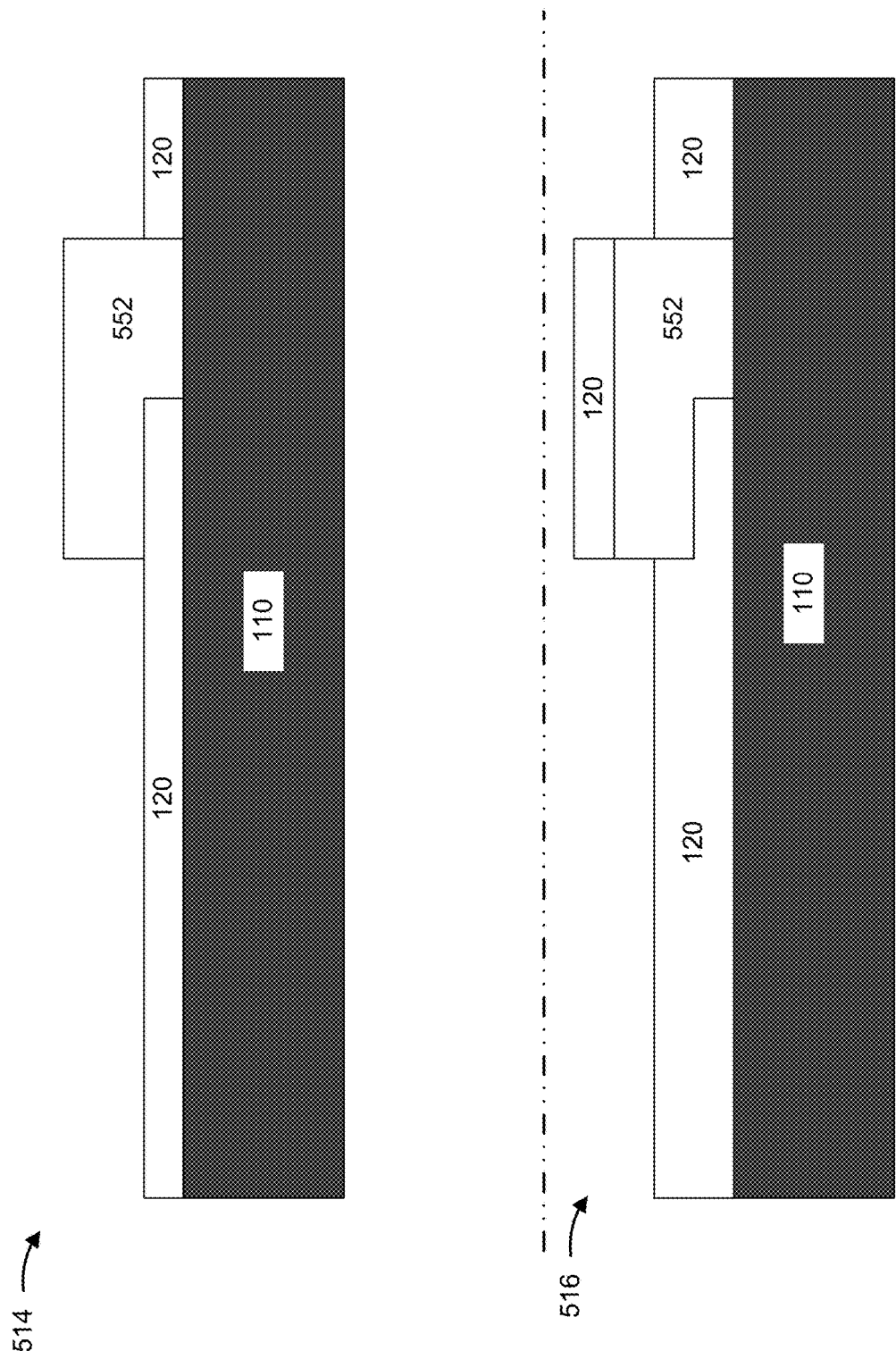

As shown in FIG. 5D, and by diagram 514, based on using another photomask (not shown) and based on exposure to light, only a portion of the other layer of photoresist 552 may remain. As shown by diagram 516, another layer of medium 120 may be deposited.

Figure 5E:
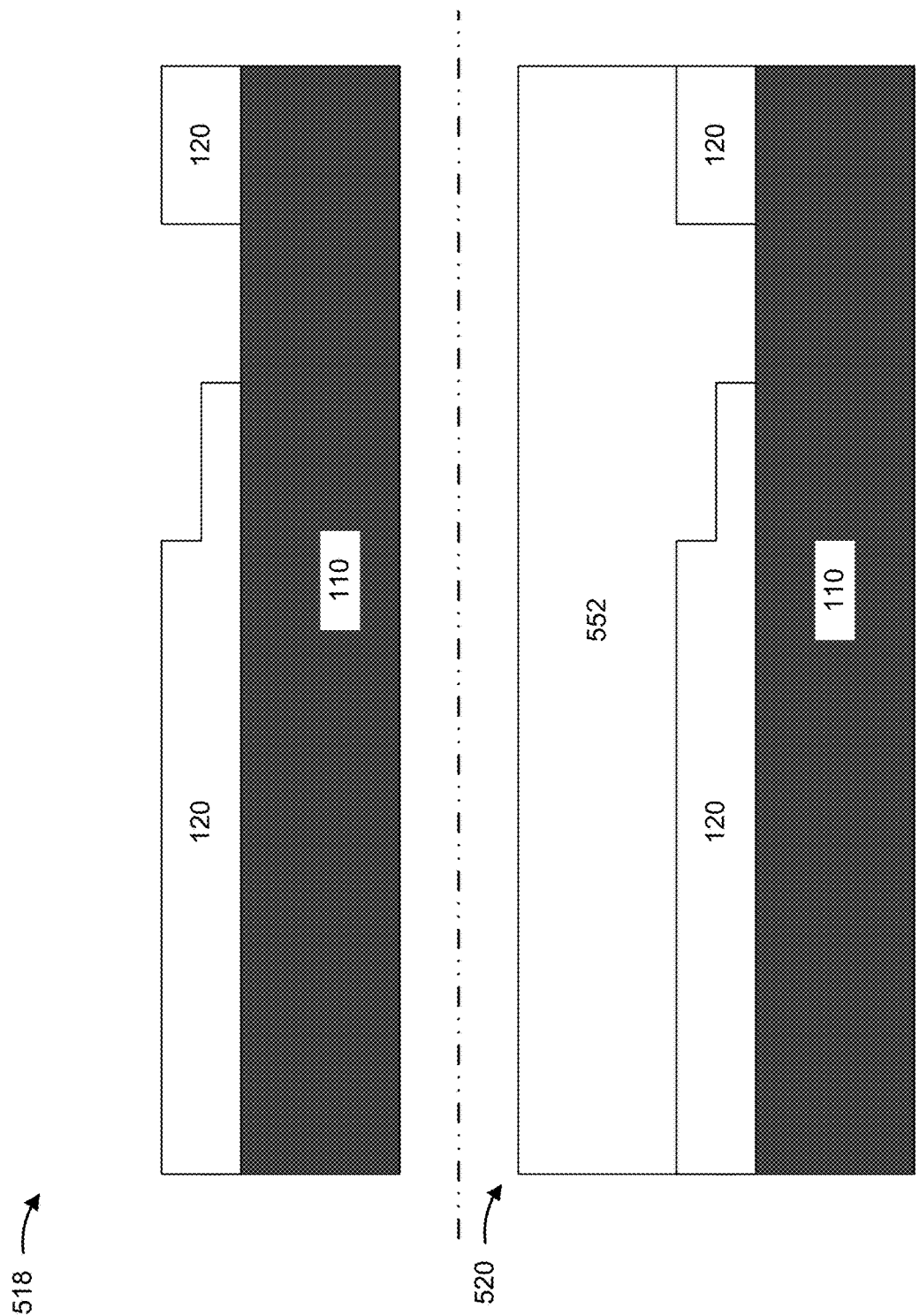

As shown in FIG. 5E, and by diagram 518, the other layer of photoresist 552 may be removed, resulting in medium 120 forming two steps. As shown by diagram 520, another layer of photoresist 552 may be deposited onto medium 120 and substrate 110.

As shown in FIG. 5F, and by diagram 522, based on using another photomask (not shown) and based on exposure to light, only a portion of the other layer of photoresist 552 may remain. As shown by diagram 524, another layer of medium 120 may be deposited.

Figure 5G:
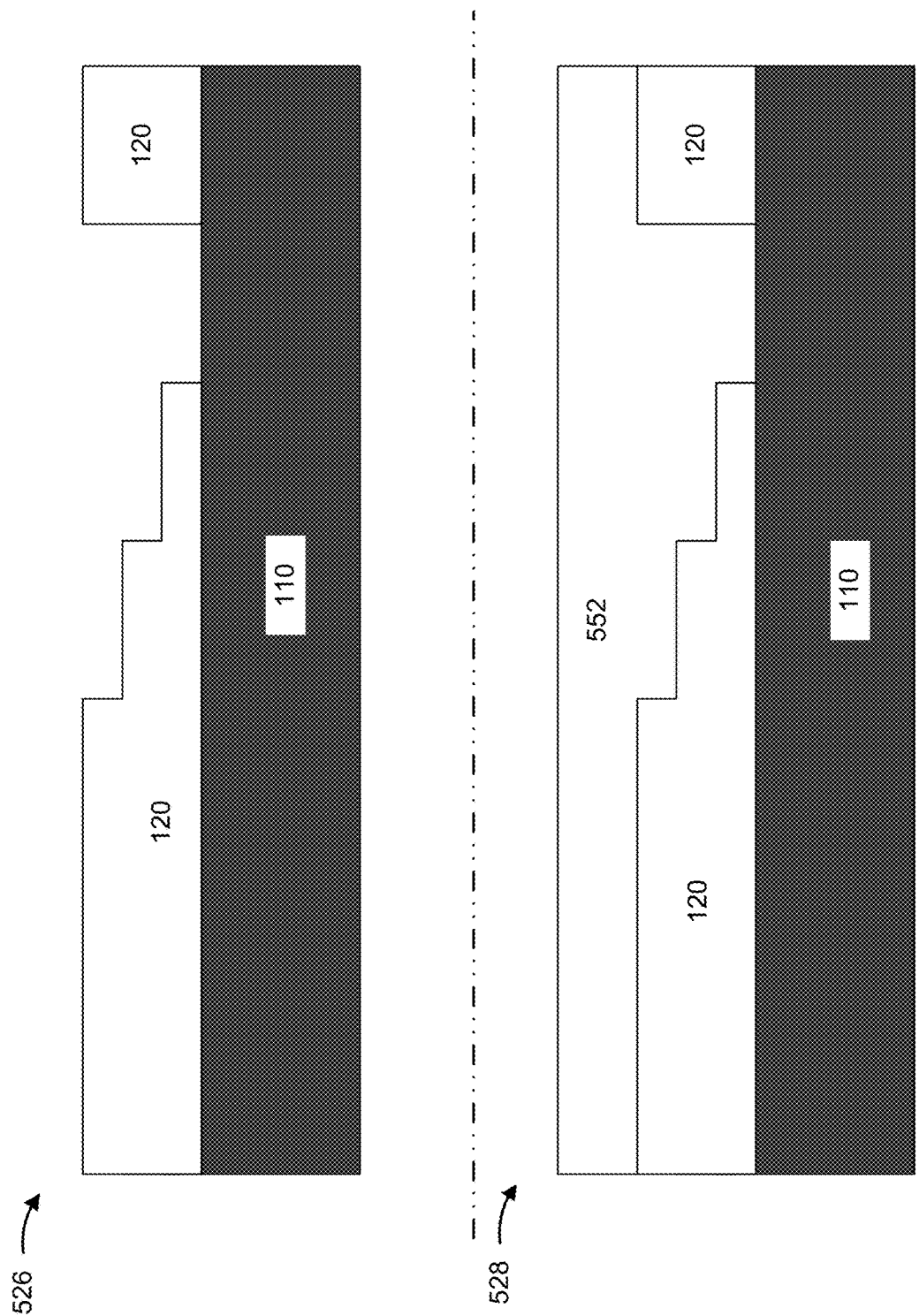

As shown in FIG. 5G, and by diagram 526, the other layer of photoresist 552 may be removed, resulting in medium 120 forming three steps. As shown by diagram 528, another layer of photoresist 552 may be deposited onto medium 120 and substrate 110.

Figure 5H:
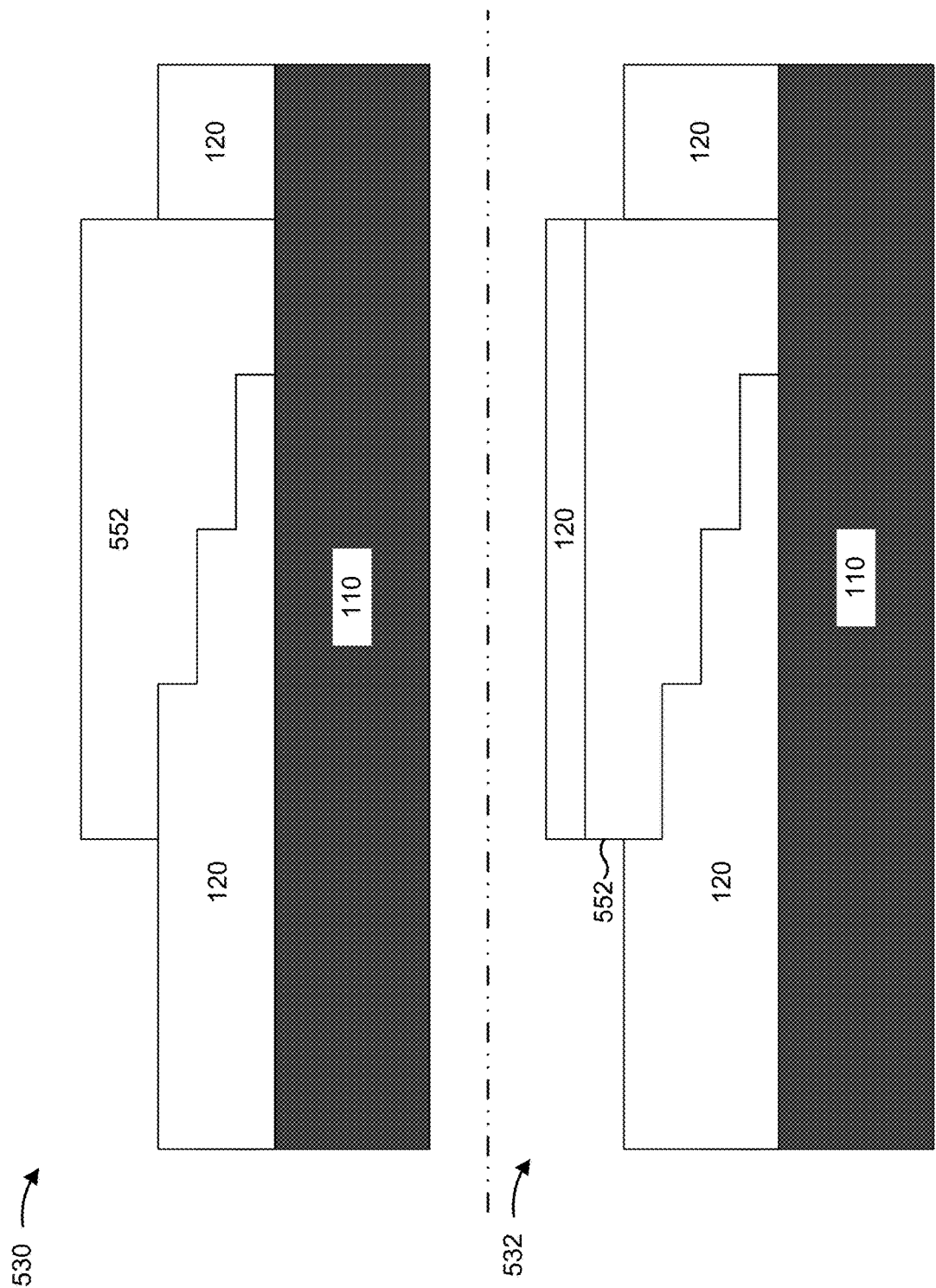

As shown in FIG. 5H, and by diagram 530, based on using another photomask 554 and 556 (not shown) and based on exposure to light, only a portion of the other layer of photoresist 552 may remain. As shown by diagram 532, another layer of medium 120 may be deposited.

As shown in FIG. 5I, and by diagram 534, the other layer of photoresist 552 may be removed, resulting in medium 120 forming 4 steps. As shown by diagram 536, after further photolithographic steps, a set of 6 steps may be formed by medium 120 with channels at each edge of the multispectral filter being a common channel.

As shown in FIG. 5J, and by diagram 538, a first mirror 558 may be deposited onto the set of 6 steps formed by medium 120. As shown by diagram 540, a spacer 560 may be deposited onto first mirror 558. In this case, a first surface of spacer 560 at an interface with first mirror 558 is stepped based on first mirror 558 having a stepped surface. Further, a second surface of spacer 560 is a non-flat surface.

Figure 5K:
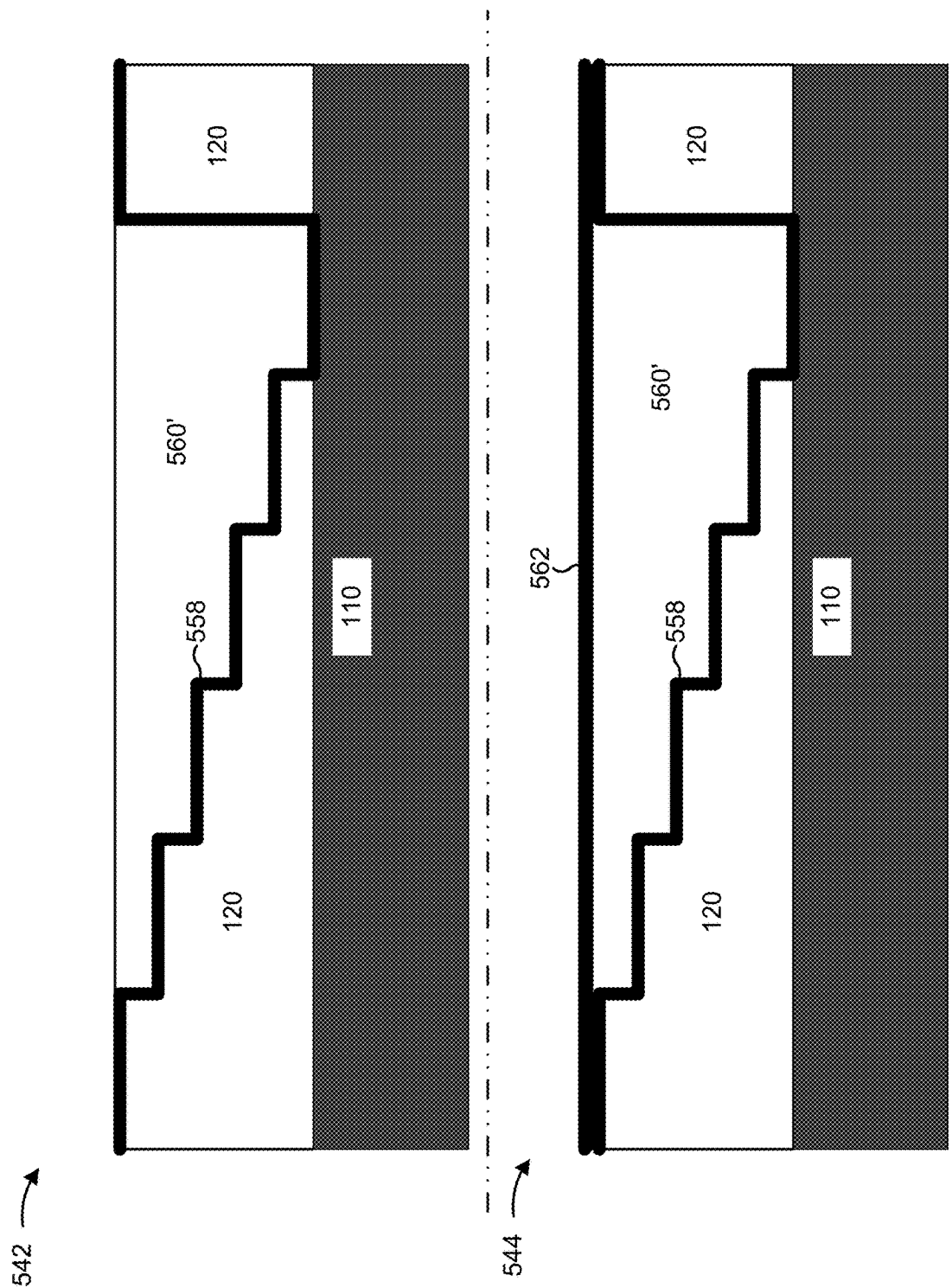

As shown in FIG. 5K, and by diagram 542, an etching procedure may remove a portion of the second surface of spacer 560 to cause the second surface of spacer 560 to be a flat surface. As shown by diagram 544, a second mirror 562 is deposited on the flat second surface of spacer 560. In this case, based on the first surface being stepped and the second surface being flat, spacer 560 forms multiple channels for the multispectral filter without multiple layers of deposition for spacer 560.

As indicated above, FIGS. 5A-5K are provided merely as examples. Other examples are possible and may differ from what was described with regard to FIGS. 5A-5K.

Figure 6:
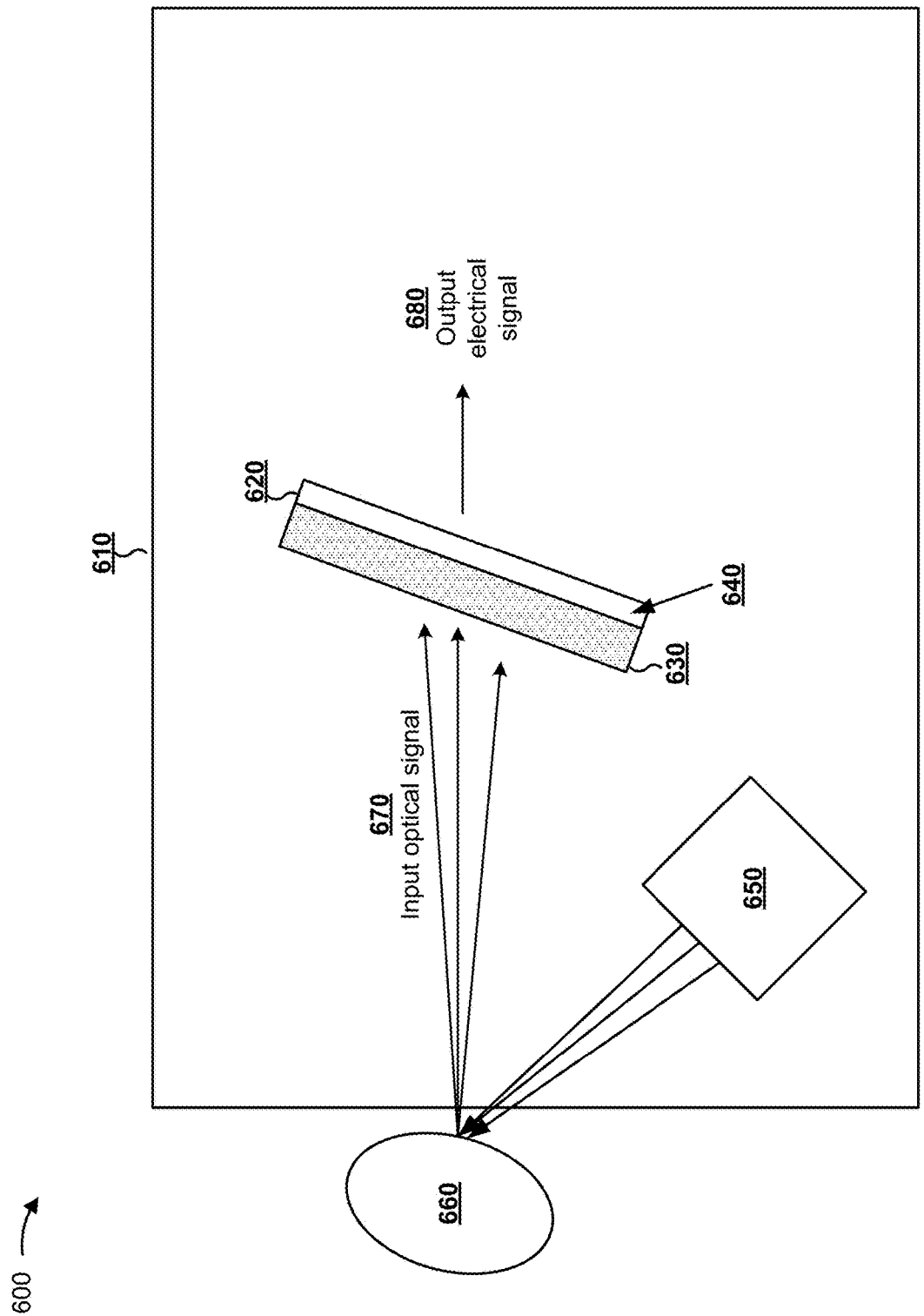
FIG. 6 is a diagram of an example implementation of a sensor system including a multispectral filter described herein.

FIG. 6 is a diagram of an example implementation 600 described herein. As shown in FIG. 6, example implementation 600 includes a sensor system 610. Sensor system 610 may be a portion of an optical system, and may provide an electrical output corresponding to a sensor determination.

For example, sensor system 610 may be a portion of a biometric system, a security system, a health monitoring system, an object identification system, a spectroscopic identification system, an imaging system, and/or the like. Sensor system 610 includes an optical filter structure 620, which includes an optical filter 630, and a set of optical sensors 640 (e.g., a sensor element array). For example, optical filter structure 620 may include an optical filter 630 that performs a bandpass blocking functionality and/or the like. In some implementations, optical filter 630 may be a multispectral filter, such as a multispectral filter with a stepped medium and a monolithic spacer, a multispectral filter with a variable thickness spacer, and/or the like. Sensor system 610 includes an optical transmitter 650 that transmits an optical signal toward a target 660 (e.g., a person, an object, etc.).

Although implementations, described herein, may be described in terms of an optical filter in a sensor system, implementations described herein may be used in another type of system, may be used external to the sensor system, and/or the like.

In some implementations, another arrangement of optical filter 630 and optical sensor 640 may be utilized. For example, rather than passing the second portion of the optical signal collinearly with the input optical signal, optical filter 630 may direct the second portion of the optical signal in another direction toward a differently located optical sensor 640. In some implementations, optical sensor 640 may be an avalanche photodiode, an Indium-Gallium-Arsenide (InGaAs) detector, an infrared detector, and/or the like.

As further shown in FIG. 6, and by reference number 670, an input optical signal is directed toward optical filter structure 620. The input optical signal may include visible light, near-infrared light, mid-infrared light, and/or the like emitted by optical transmitter 650 and ambient light from the environment in which sensor system 610 is being utilized. For example, when optical filter 630 is a bandpass multispectral filter with multiple channels, optical transmitter 650 may direct multiple wavelength ranges of near-infrared light toward an object for a spectroscopic measurement, and the near-infrared light may be reflected off target 660 (e.g., the object) toward optical sensors 640 to permit optical sensors 640 to perform a measurement of the multiple wavelength ranges of near-infrared light. In this case, ambient light may be directed toward optical sensor 640 from one or more ambient light sources (e.g., a light bulb or the sun).

In another example, multiple light beams may be directed toward target 660 and a subset of the multiple light beams may be reflected toward optical filter structure 620, which may be disposed at a tilt angle relative to optical sensor 640, as shown. In some implementations, another tilt angle may be used. In some implementations, optical filter structure 620 may be disposed and/or formed directly onto optical sensors 640, disposed a distance from optical sensors 640 (e.g., via free-space optics), and/or the like. For example, optical filter structure 620 may be coated and patterned onto optical sensors 640 using, for example, photolithography, a sputter deposition technique (e.g., using argon gas and helium gas as an inert gas mixture for sputter deposition), and/or the like.

In another example, optical transmitter 650 may direct near-infrared light toward another type of target 660, such as for detecting a gesture in a gesture recognition system, detecting objects in proximity to a vehicle, detecting objects in proximity to a blind person, detecting a proximity to an object (e.g., using a LIDAR technique), and/or the like, and the near-infrared light and ambient light may be directed toward optical sensor 640 as a result.

In some implementations, a portion of the optical signal is passed by optical filter 630 and optical filter structure 620. For example, differing spacer thicknesses of different channels of optical filter 630 may cause a first portion of light to be reflected and a second portion of light to be passed. In this case, optical filter 630 may include multiple channels formed by a spacer in connection with a stepped medium and each channel may pass a different wavelength of light. Additionally, or alternatively, two or more channels may pass a common wavelength of light.

As further shown in FIG. 6, and by reference number 680, based on the portion of the optical signal being passed to optical sensor 640, optical sensor 640 may provide an output electrical signal for sensor system 610, such as for use in performing a spectroscopic measurement, recognizing a gesture of the user, detecting the presence of an object, and/or the like.

As indicated above, FIG. 6 is provided merely as an example. Other examples are possible and may differ from what was described with regard to FIG. 6.

The foregoing disclosure provides illustration and description, but is not intended to be exhaustive or to limit the implementations to the precise form disclosed. Modifications and variations are possible in light of the above disclosure or may be acquired from practice of the implementations.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, and/or the like.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related items, and unrelated items, etc.), and may be used interchangeably with "one or more." Where only one item is intended, the term "one" or similar language is used. Also, as used herein, the terms "has," "have," "having," and/or the like are intended to be open-ended terms. Further, the phrase "based on" is intended to mean "based, at least in part, on" unless explicitly stated otherwise.

What is claimed is:

1. A filter, comprising:
    a substrate;
    a stepped medium disposed on the substrate;
    a first mirror disposed on the stepped medium;
        wherein the first mirror forms a stepped mirror surface, wherein each step, of the stepped mirror surface corresponds to a channel, of a set of channels, of the filter,
wherein the stepped medium forms a set of pillars, and
wherein at least one pillar, of the set of pillars, forms an inactive channel;
a spacer disposed on the stepped mirror surface; and
a second mirror disposed on another surface of the spacer.

2. The filter of claim 1, wherein the stepped medium is stepped in one dimension.

3. The filter of claim 1, wherein the stepped medium is stepped in two dimensions.

4. The filter of claim 1, wherein a wavelength range of the set of channels of the filter is between approximately 380 nanometers (nm) and 780 nm.

5. The filter of claim 1, wherein a wavelength range of the set of channels of the filter is between approximately 750 nanometers (nm) and 1100 nm.

6. The filter of claim 1, wherein the stepped medium is associated with a greater than 70% transmissivity at a wavelength range of the filter and is one of:
an oxide based medium,
a semiconductor based medium,
a dielectric based medium,
a polymer based medium,
a nitride based medium,
a phosphide based medium, or
a carbide based medium.

7. The filter of claim 1, wherein the spacer is associated with a refractive index greater than 1.7 and is one of:
hydrogenated silicon based spacer,
an oxide based spacer,
a germanium based spacer, or
a silicon germanium based spacer.

8. A filter, comprising:
a substrate;
a stepped medium disposed on the substrate;
a first mirror disposed on the stepped medium;
wherein the first mirror forms a stepped mirror surface, and
wherein each step, of the stepped mirror surface corresponds to a channel, of a set of channels, of the filter,
a spacer disposed on the stepped mirror surface,
wherein the spacer is at least one of:
a gaseous spacer,
a liquid spacer; and
a second mirror disposed on another surface of the spacer.

9. The filter of claim 8, wherein the stepped medium forms a set of pillars, and
wherein at least one pillar, of the set of pillars, forms an inactive channel.

10. A system, comprising:
a sensor element array comprising a plurality of sensor elements associated with a plurality of channels; and
a variable spacer filter, comprising:
a first substrate;
a stepped medium disposed on the first substrate;
a first mirror disposed on the stepped medium;
wherein the first mirror forms a stepped mirror surface,
wherein each step, of the stepped mirror surface corresponds to a channel, of a set of channels, of the filter; and
a second mirror disposed on a second substrate and alignable to the first mirror,
wherein a cavity separates the first mirror and the second mirror, and
wherein the second mirror is translatable with respect to the first mirror such that a spacing between the first mirror and the second mirror is variable.

11. The system of claim 10, wherein the cavity is filled with a spacer,
wherein the spacer is a gaseous spacer material or a liquid spacer material, and
wherein the spacer is constrained such that the spacer fills the cavity when the second mirror is translated with respect to the first mirror.

12. The system of claim 10, wherein one or more channels, of the set of channels, are tunable based on the second mirror being translated with respect to the first mirror.

13. The system of claim 10, wherein the cavity is at least partially filled by a first spacer material and at least partially filled by a second spacer material, and
wherein the first spacer material and the second spacer material are one of:
two solid spacer materials,
a solid spacer material and a liquid spacer material,
a solid spacer material and a gaseous spacer material, or
a liquid spacer material and a gaseous spacer material.

14. The system of claim 10, further comprising:
a translation device to translate the second mirror with respect to the first mirror.

15. The system of claim 10, further comprising:
a plurality of translation devices to angle the second mirror with respect to the first mirror.

16. A multichannel filter, comprising:
a medium to form a stepped structure;
a first mirror, disposed on the stepped structure, to form a stepped mirror structure,
wherein each step, of the stepped mirror structure, forms a wavelength channel of the multichannel filter;
a spacer disposed on the first mirror,
wherein a first surface of the spacer is disposed against the first mirror to form a stepped surface and a second surface of the spacer is opposite the first mirror to form a flat surface; and
a second mirror, disposed on the second surface of the spacer form a flat mirror for the multichannel filter.

17. The multichannel filter of claim 16, wherein the medium is formed using a photolithography procedure.

18. The multichannel filter of claim 16, wherein the spacer is deposited in a single deposition step.

19. The multichannel filter of claim 16, wherein the first mirror or the medium is an etch stop for removing a portion of the spacer.

20. The multichannel filter of claim 16, wherein the stepped structure of the medium is formed by at least one of:
a lift off procedure,
an etching procedure,
a molding procedure,
a casting procedure,
a machining procedure,
a stamping procedure, or
a scraping procedure.

* * * * *

UNITED STATES PATENT AND TRADEMARK OFFICE
CERTIFICATE OF CORRECTION

PATENT NO. : 10,962,694 B2
APPLICATION NO. : 16/179480
DATED : March 30, 2021
INVENTOR(S) : William D. Houck et al.

It is certified that error appears in the above-identified patent and that said Letters Patent is hereby corrected as shown below:

In the Claims

Column 13, Line 46, change "a gaseous spacer," to -- a gaseous spacer, or --

Signed and Sealed this
Twelfth Day of July, 2022

*Katherine Kelly Vidal*

Katherine Kelly Vidal
*Director of the United States Patent and Trademark Office*